US009490797B2

(12) United States Patent
Tabata et al.

(10) Patent No.: US 9,490,797 B2
(45) Date of Patent: Nov. 8, 2016

(54) DRIVE DEVICE

(71) Applicant: Panasonic Intellectual Property Management Co., Ltd., Osaka (JP)

(72) Inventors: Osamu Tabata, Osaka (JP); Hideaki Fujiwara, Osaka (JP); Shuichi Nagai, Osaka (JP); Yasufumi Kawai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/830,717

(22) Filed: Aug. 19, 2015

(65) Prior Publication Data
US 2016/0112040 A1 Apr. 21, 2016

(30) Foreign Application Priority Data

Oct. 15, 2014 (JP) ................. 2014-210927

(51) Int. Cl.
*H03B 1/00* (2006.01)
*H03K 3/00* (2006.01)
*H03K 17/22* (2006.01)
*H03K 17/16* (2006.01)
*H03K 17/691* (2006.01)

(52) U.S. Cl.
CPC .......... *H03K 17/223* (2013.01); *H03K 17/162* (2013.01); *H03K 17/691* (2013.01)

(58) Field of Classification Search
CPC ...... H03K 17/04; H03K 17/691; G05F 5/00; H02M 1/08
USPC ........... 327/108–112, 427, 434, 437; 326/82, 326/83, 87
See application file for complete search history.

(56) References Cited

U.S. PATENT DOCUMENTS

| 5,019,719 A * | 5/1991 | King ..................... H03K 5/12 327/108 |
| 2013/0033914 A1* | 2/2013 | Yahata .................. H02M 7/48 363/132 |
| 2014/0049297 A1 | 2/2014 | Nagai et al. |

FOREIGN PATENT DOCUMENTS

WO 2013/065254 5/2013

* cited by examiner

*Primary Examiner* — Lincoln Donovan
*Assistant Examiner* — Thomas Skibinski
(74) *Attorney, Agent, or Firm* — McDermott Will & Emery LLP

(57) ABSTRACT

A drive device that drives a semiconductor switching device includes a capacitor, an output selection unit that selects whether or not to supply a charge of the capacitor to a conduction control terminal of the semiconductor switching device, and a charge consumption unit that supplies the charge of the capacitor to a portion other than the conduction control terminal, thereby consuming the charge of the capacitor.

7 Claims, 20 Drawing Sheets

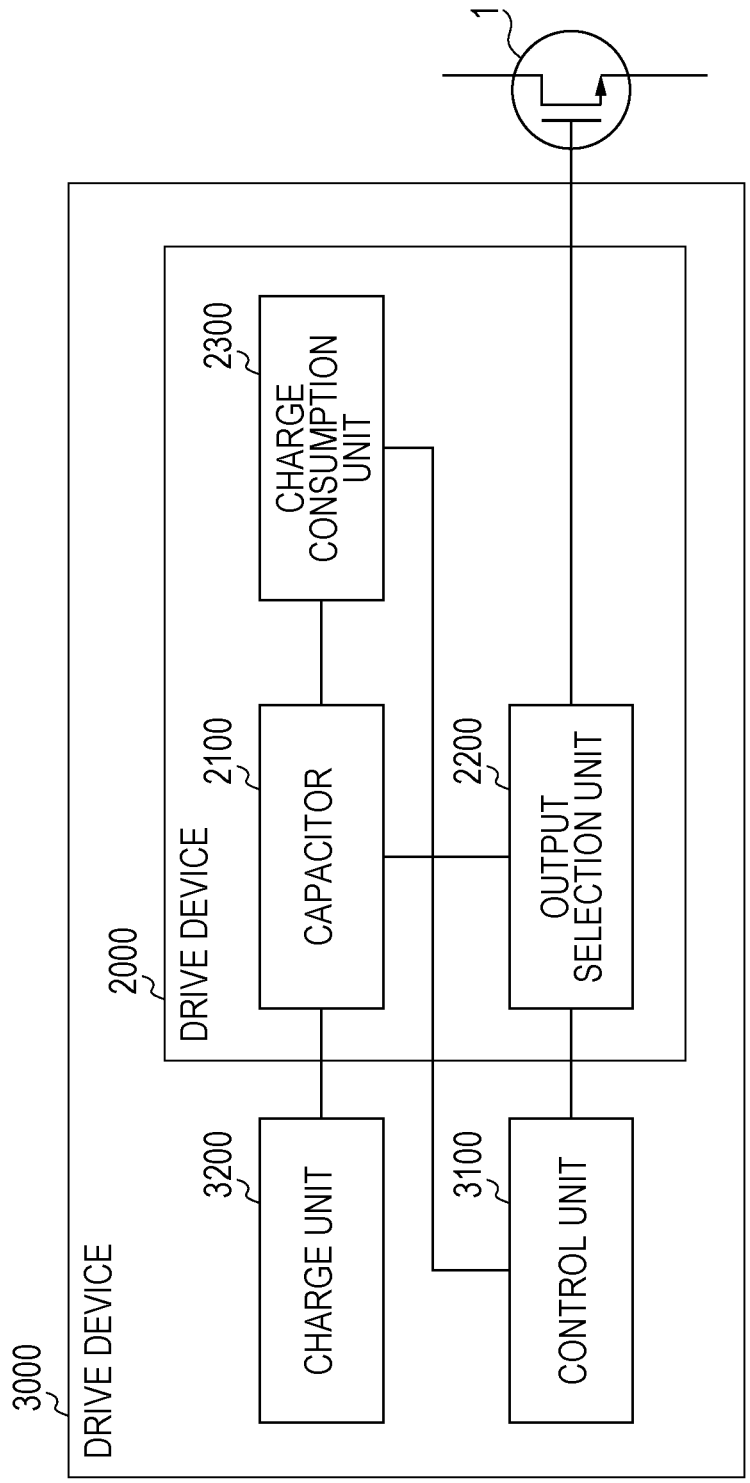

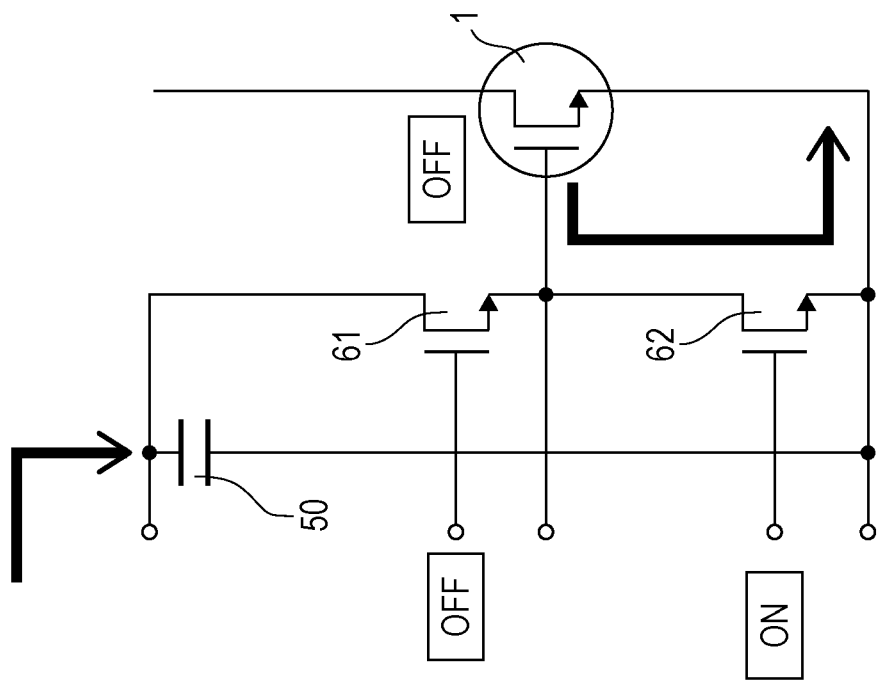
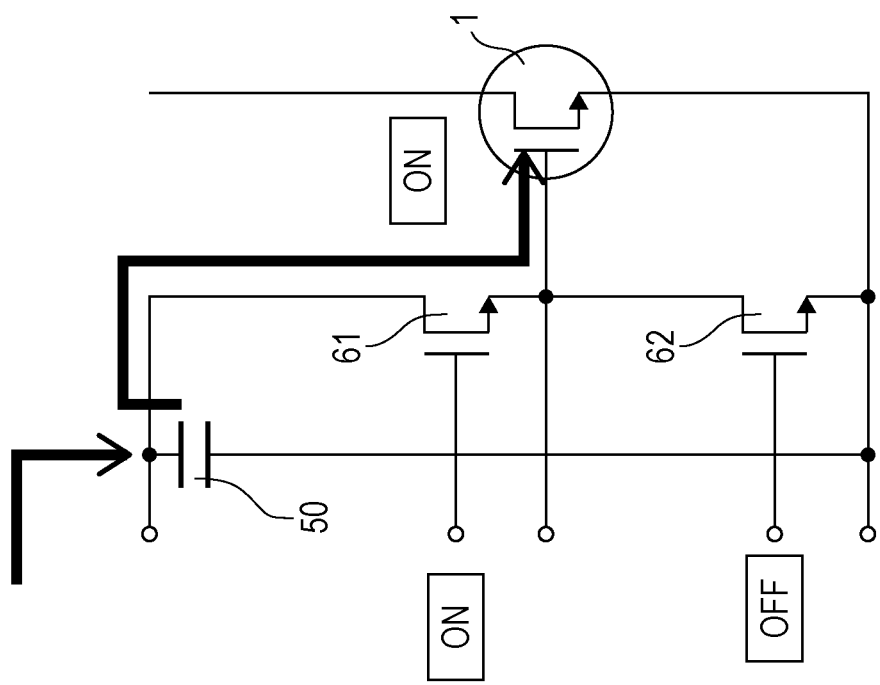

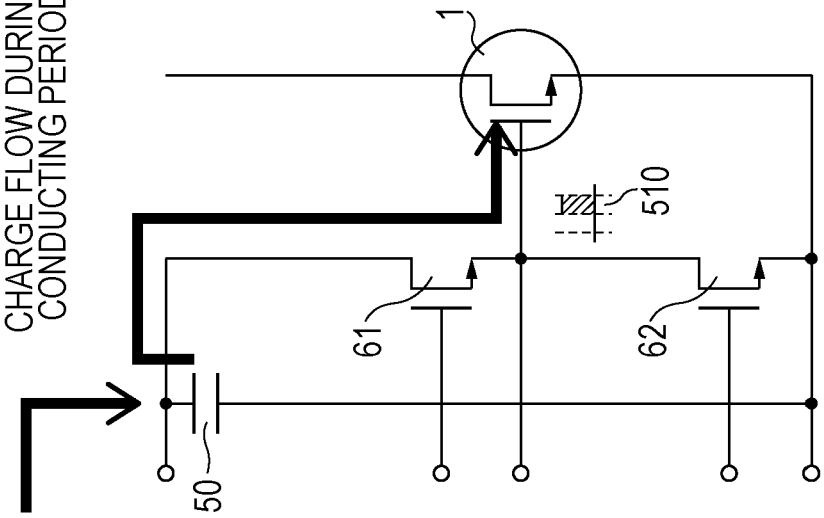
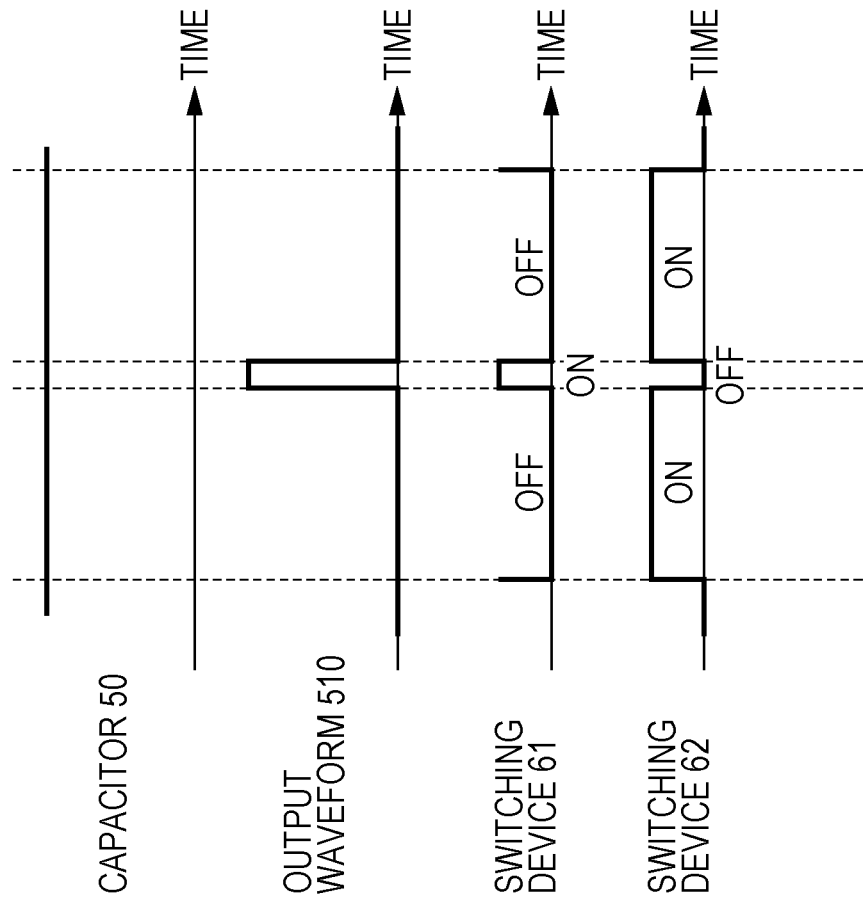

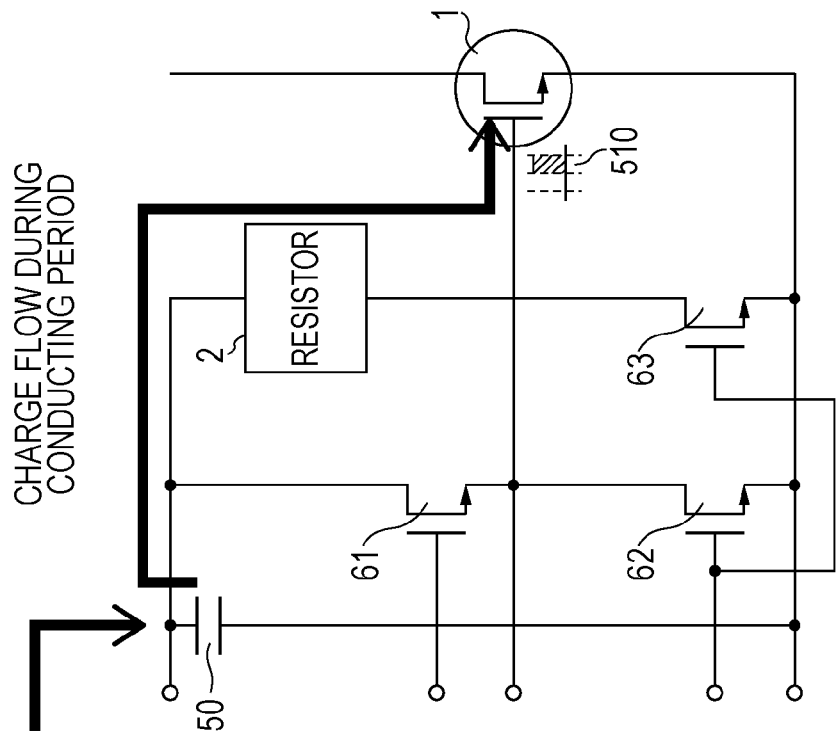
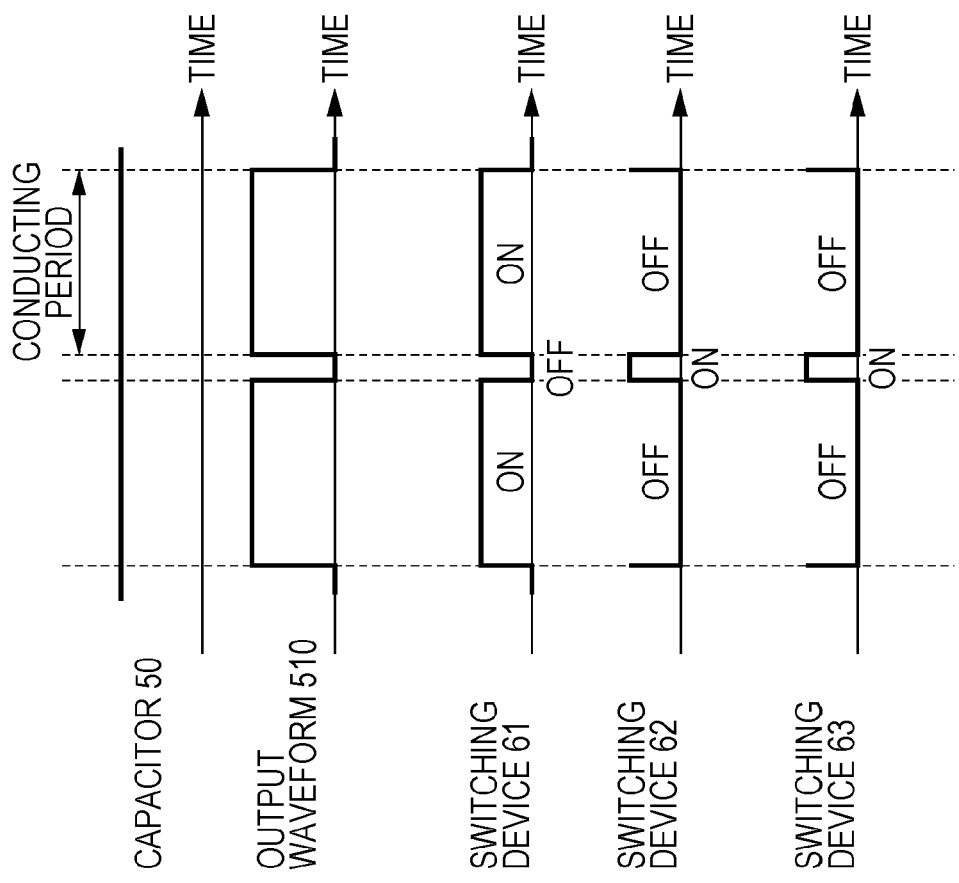

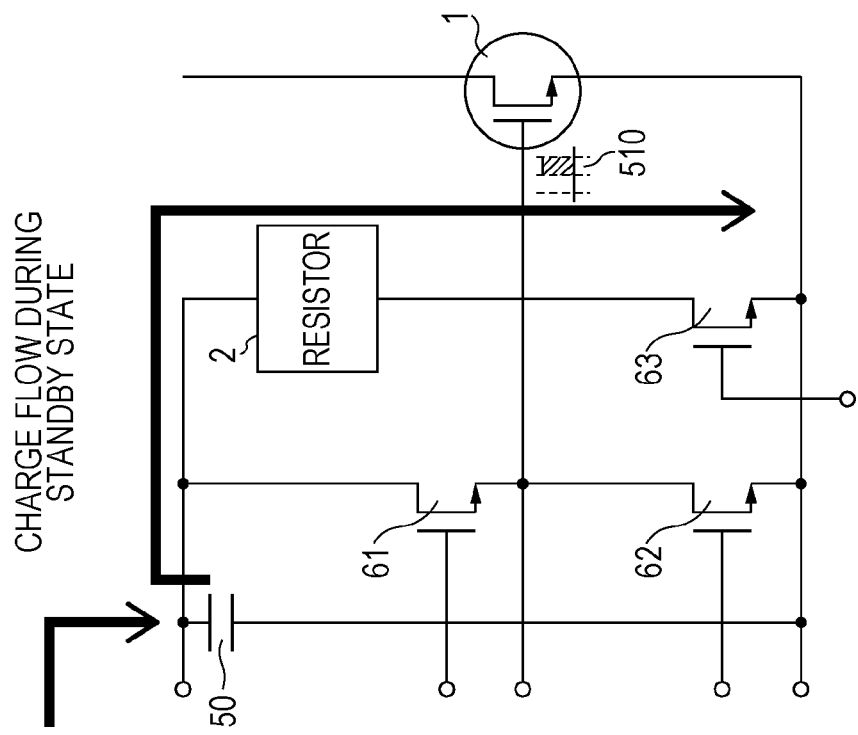
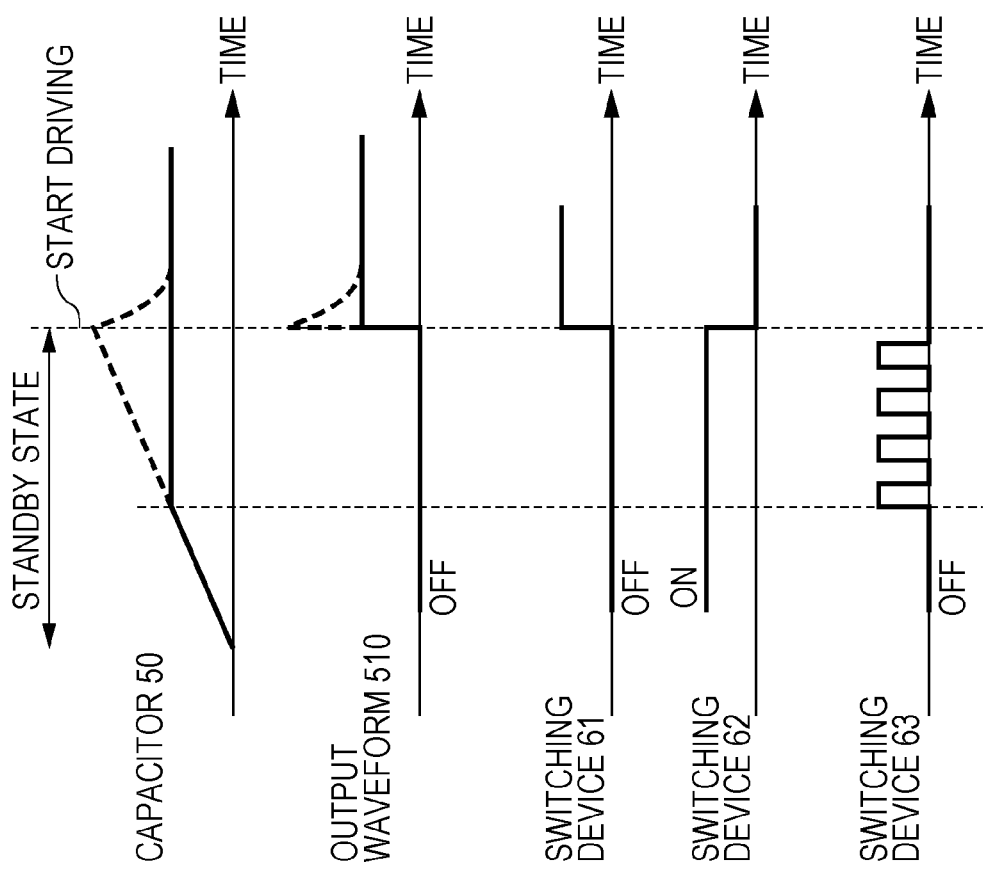

DRIVE DEVICE

BACKGROUND

1. Technical Field

The present disclosure relates to driving of a semiconductor switching device.

2. Description of the Related Art

International Publication No. 2013/065254, for example, discloses a drive device that drives a semiconductor switching device. The related art has not been able to suppress occurrence of output fluctuation due to imbalance in charge consumption between when conducting and when not conducting.

SUMMARY

In one general aspect, the techniques disclosed here feature a drive device that drives a semiconductor switching device. The drive device includes a capacitor, an output selection unit that selects whether or not to supply a charge of the capacitor to a conduction control terminal of the semiconductor switching device, and a charge consumption unit that supplies the charge of the capacitor to a portion other than the conduction control terminal, thereby consuming the charge of the capacitor.

According to the present disclosure, occurrence of output fluctuation due to imbalance in charge consumption between when conducting and when not conducting can be suppressed.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3 is a diagram illustrating a schematic configuration of a drive device which is an example of the drive device according to the first embodiment;

FIGS. 4A and 4B are diagrams for describing an operation example of a half bridge circuit, which is an example of an output selection unit;

FIGS. 6A and 6B are diagrams illustrating a comparative example according to a second embodiment;

FIGS. 7A and 8B are diagrams illustrating a comparative example according to the second embodiment;

FIGS. 12A and 12B are diagrams illustrating drive waveforms and charge flow during a conducting period;

FIGS. 16A and 16B are diagrams illustrating an example of a circuit of a drive device according to a third embodiment, and drive waveforms;

DETAILED DESCRIPTION

Embodiments will be described below in detail with reference to the drawings.

First Embodiment

Figure 1:
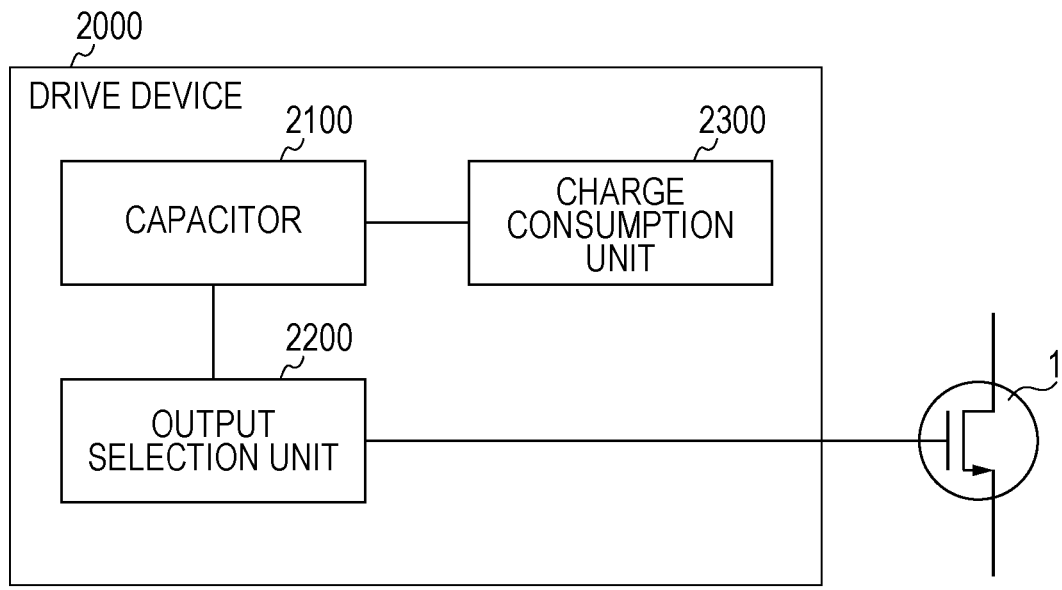
FIG. 1 is a diagram illustrating a schematic configuration of a drive device according to a first embodiment.

FIG. 1 is a diagram illustrating a schematic configuration of a drive device 2000 according to a first embodiment. The drive device 2000 is a drive device that drives a semiconductor switching device 1 (e.g., power semiconductor device or power transistor). The drive device 2000 according to the first embodiment includes a capacitor 2100, an output selection unit 2200, and a charge consumption unit 2300. The output selection unit 2200 selects whether or not to supply charge from the capacitor 2100 to a conduction control terminal (e.g. gate terminal) of the semiconductor switching device 1. The charge consumption unit 2300 supplies charge from the capacitor 2100 to a portion (e.g. other element, other path or other terminal) other than the conduction control terminal, thereby consuming the charge of the capacitor 2100.

According to this configuration, the amount of charge stored in the capacitor can be adjusted, and accordingly output fluctuation occurring in cases of performing different pulse-width modulation (PWM) driving at different times, for example, can be reduced. This also enables compensation for fluctuation or variance in charge storage capabilities depending on temperature properties of the capacitor, and so forth.

Figure 2:
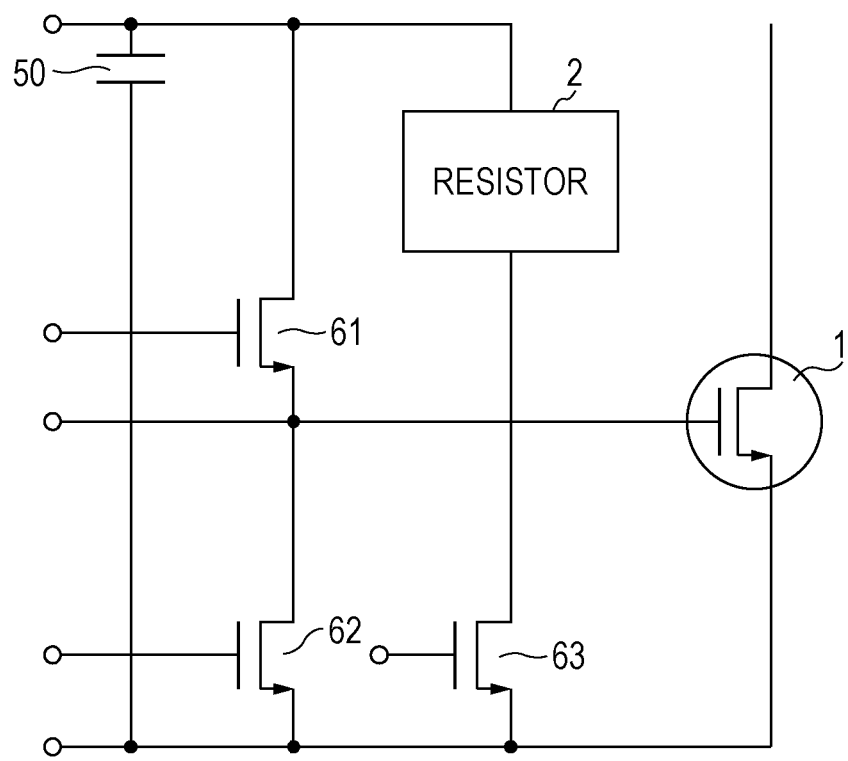
FIG. 2 is a diagram illustrating an example of a circuit making up the drive device according to the first embodiment.

FIG. 2 is a diagram illustrating an example of a circuit making up the drive device 2000 according to the first embodiment. In the configuration illustrated in FIG. 2, the output selection unit 2200 includes a first switching device 61 and a second switching device 62. The charge consumption unit 2300 includes a third switching device 63 and a resistor 2.

A first terminal of the capacitor 50 and a first terminal (e.g. drain terminal) of the first switching device 61 are connected with each other at a first contact point. A second terminal of the capacitor 50 and a terminal (e.g. source terminal) of the semiconductor switching device 1 are connected with each other at a second contact point. A second terminal (e.g. source terminal) of the first switching device 61 and a conduction control terminal of the semiconductor switching device 1 are connected with each other at a third contact point. A first terminal (e.g. drain terminal) of the second switching device 62 connects to the third contact point. A second terminal (e.g. source terminal) of the second switching device 62 connects to the second contact point. A first terminal (e.g. drain terminal) of the third switching device 63 connects to a second terminal of the resistor 2. A second terminal (e.g. source terminal) of the third switching device 63 connects to the second contact point. The first terminal of the resistor 2 connects to the first contact point. According to this configuration, a driving device can be realized with few parts and a simple configuration.

The third switching device 63 serves as a transistor to control consumption of the stored charge. The resistor 2 serves as a restricting resistor to determine the amount of charge consumption. According to the first embodiment, the timing of consuming the stored charge and the amount of charge consumption can be freely set. Accordingly, the output wave peak value of an output waveform 510 can be freely set, thus enabling compensation for variance output voltage, temperature properties, and so forth.

FIG. 3 is a diagram illustrating a schematic configuration of a drive device 3000 which is an example of the drive device according to the first embodiment. The drive device according to the first embodiment may include, in addition to the configuration of the drive device 2000 described above, a control unit 3100 and a charge unit 3200, as shown in the drive device 3000 in FIG. 3.

The control unit 3100 controls the output selection unit 2200 and the charge consumption unit 2300. The control unit 3100 may be a control unit described in the later-described second through fifth embodiments, or the like, for example. The control unit 3100 may be configured with a processor (e.g. a CPU (Central Processing Unit) or a MPU (Micro-Processing Unit)). This processor may operate the control method shown in present disclosure, by executing a program read from a memory. The charge unit 3200 charges the capacitor 2100. The charge unit 3200 may be a charge unit described in the later-described second through fifth embodiments, or the like, for example.

Figure 5:
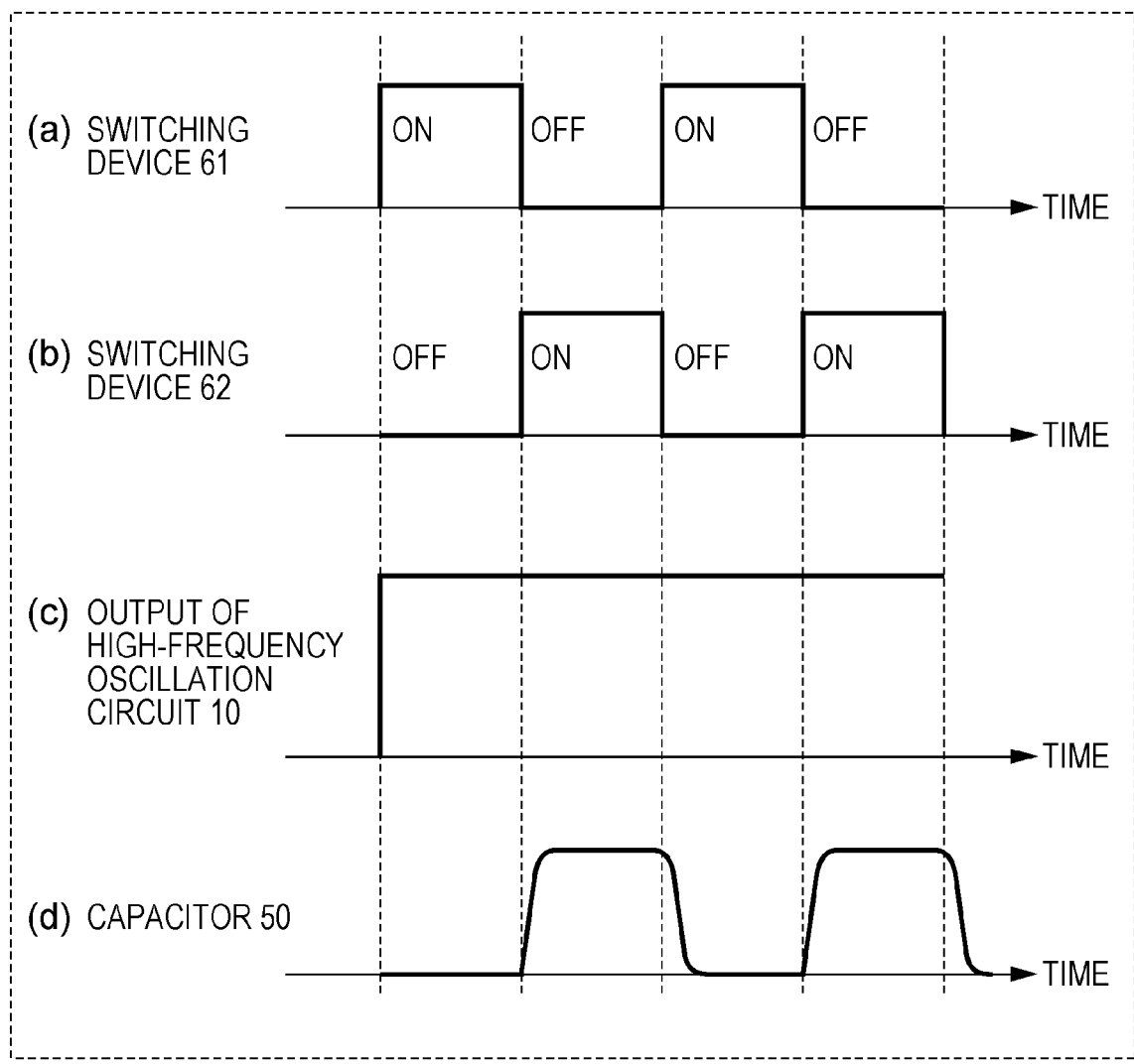
FIG. 5 is a diagram illustrating the relationship between voltage across the gate/source of transistors making up the half bridge circuit, and electric charge that is charged to a capacitor.
Figure 7B:
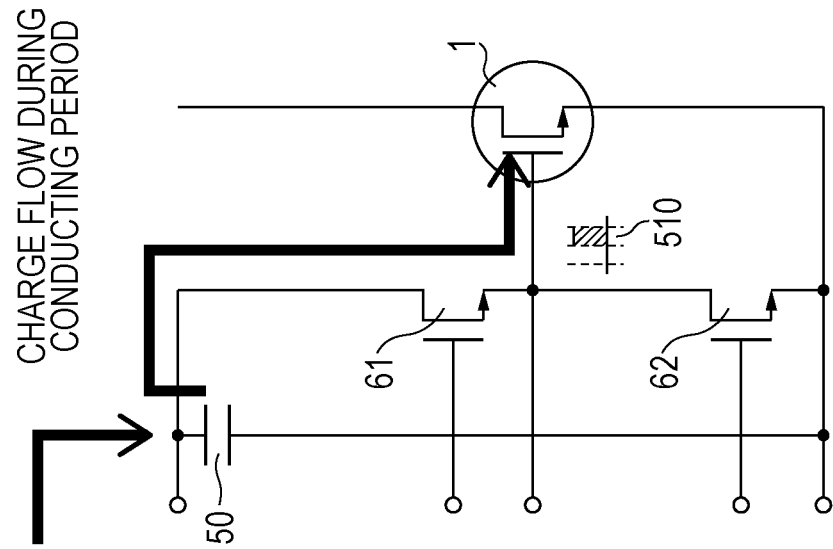
Figure 7A:
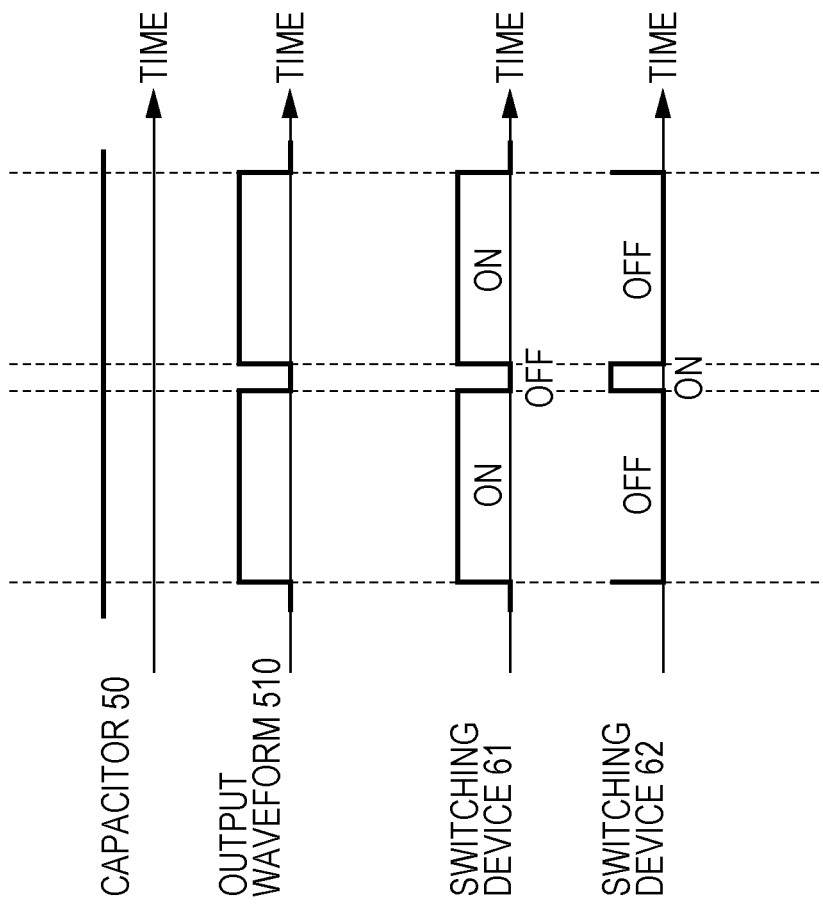

FIGS. 4A and 4B are diagrams for describing an operation example of a half bridge circuit 60, which is an example of the output selection unit 2200. FIG. 5 is a diagram illustrating the relationship between voltage across the gate/source of the first switching device 61 (e.g., transistor) and second switching device 62 (e.g. transistor) making up the half bridge circuit, and electric charge that is charged to a capacitor 50.

Note that the voltage across the gate/source is voltage at the gate terminal with the source terminal of the switching devices as a reference. FIG. 5 also illustrates output of a high-frequency oscillation circuit 10 to a third electromagnetic resonance coupler 20c, i.e., amplitude of a second harmonic. The details of them are described in the fifth embodiment.

A half bridge circuit 60 repeatedly alternates between a state in which the first switching device 61 is on (conducting) and the second switching device 62 is off (non-conducting), and a state where the first switching device 61 is off and the second switching device 62 is on, in accordance with a first signal and a second signal, which are control signals that are input, as illustrated by (a) and (b) in FIG. 5. Thus, the half bridge circuit 60 performs switching of the semiconductor switching device 1. That is to say, the half bridge circuit 60 supplies charge (e.g., driving electric power) charged at the capacitor 50, in accordance with input signals. That is to say, the semiconductor switching device 1 is switched to on (conducting state).

FIG. 4B illustrates a state where the first switching device 61 is off and the second switching device 62 is on. That is to say, FIG. 4B is a state where off voltage is applied between the gate and source of the first switching device 61, and on voltage is applied between the gate and source of the second switching device 62. In the state in FIG. 4B, the capacitor 50 is charged by a charge, but the first switching device 61 is in the off state, so current is not supplied to the semiconductor switching device 1. That is to say, the semiconductor switching device 1 is in an off (non-conducting) state.

On the other hand, FIG. 4A illustrates a state where the first switching device 61 is on and the second switching device 62 is off. That is to say, FIG. 4A is a state where on voltage is applied between the gate and source of the first switching device 61, and off voltage is applied between the gate and source of the second switching device 62. In the state in FIG. 4A, the charge which was charged to the capacitor 50 in the state in FIG. 4B is supplied to the gate terminal of the semiconductor switching device 1.

In a case where the state in FIG. 4A is switched to a state where the first switching device 61 is off and the second switching device 62 is on, the charge stored in the capacitor 50 increases again, as illustrated in FIG. 4B. The charge stored at the gate terminal of the semiconductor switching device 1 is discharged to an output reference terminal 72 by the second switching device 62. The above operations enable the drive device according to the first embodiment to instantaneously supply a large current to the semiconductor switching device 1.

Second Embodiment

A drive device according to a second embodiment includes, in addition to the configuration of the drive device according to the first embodiment described above, the following configuration as well. A period where the charge of the capacitor is supplied to the conduction control terminal of the semiconductor switching device by the output selection unit as will be defined as a "supply period". A period where the charge of the capacitor is not supplied to the conduction control terminal of the semiconductor switching device by the output selection unit will be defined as a "non-supply period". A supply period and a non-supply period together make up one cycle.

The output selection unit of the drive device according to the second embodiment generates a first drive cycle where the ratio of the supply period in one cycle is a first ratio, and a second drive cycle where the ratio of the supply period in one cycle is a second ratio that is greater than the first ratio. The amount of the charge of the capacitor that is consumed by the charge consumption unit during the first drive cycle is greater than the amount of the charge of the capacitor that is consumed by the charge consumption unit during the second drive cycle. This configuration enables output fluctuation occurring in cases of performing different PWM driving at different times to be suppressed.

The charge consumption unit of the drive device according to the second embodiment may consume the charge of the capacitor during the non-supply period, and not consume the charge of the capacitor during the supply period. This configuration enables consumption of the charge of the capacitor according to the duration of the non-supply period. Accordingly, a greater amount of the charge of the capacitor can be consumed in a period where the ratio of the non-supply period in one cycle is great.

The output selection unit in the drive device according to the second embodiment may include a first switching device and a second switching device. The charge consumption unit may include a third switching device.

The drive device according to the second embodiment may also include a control unit that generates control signals to control the conducting state of each of the first switching device, second switching device, and third switching device. The charge of the capacitor may be supplied to the conduction control terminal of the semiconductor switching device by the first switching device going to the conducting state in response to a control signal from the control unit. The charge of the capacitor may be extracted from the conduction control terminal of the semiconductor switching device by the second switching device going to the conducting state in response to a control signal from the control unit. The charge of the capacitor may be supplied to a portion other than the conduction control terminal by the third switching device going to the conducting state in response to a control signal from the control unit, thereby consuming the charge of the capacitor.

At this time, the control unit may control the conducting state of the third switching device by transmitting to the third switching device a control signal to be transmitted to the second switching device. This configuration enables the charge of the capacitor to be consumed depending on the duration of the period where the second switching device is in the conducting state (i.e., the above-described non-supply period). Accordingly, a greater amount of the charge of the capacitor can be consumed in a period where the ratio of the non-supply period in one cycle is great.

The drive device according to the second embodiment may also include a charge unit that charges a charge to the capacitor. The charge unit may charge the charge to the capacitor over a period spanning the first drive period and the second drive period. This configuration enables a constant charging voltage to be supplied to the capacitor, for example. Accordingly, the amount of the charge stored in the capacitor can be precisely adjusted by consumption of the charge by the charge consumption unit.

FIGS. 6A through 8 are diagrams illustrating a comparative example of the second embodiment. In a case where the conducting period is short (case where the conducting period of the first switching device 61 is short), the amount of the charge stored in the capacitor that is consumed is less in comparison with a case where the conducting period is long, as illustrated in FIGS. 6A through 7B. Accordingly, when the conducting time is short in the configuration according to the comparative example, the output wave peak value of the output waveform 510 is higher in comparison with a case when the conducting period is long.

Figure 8:
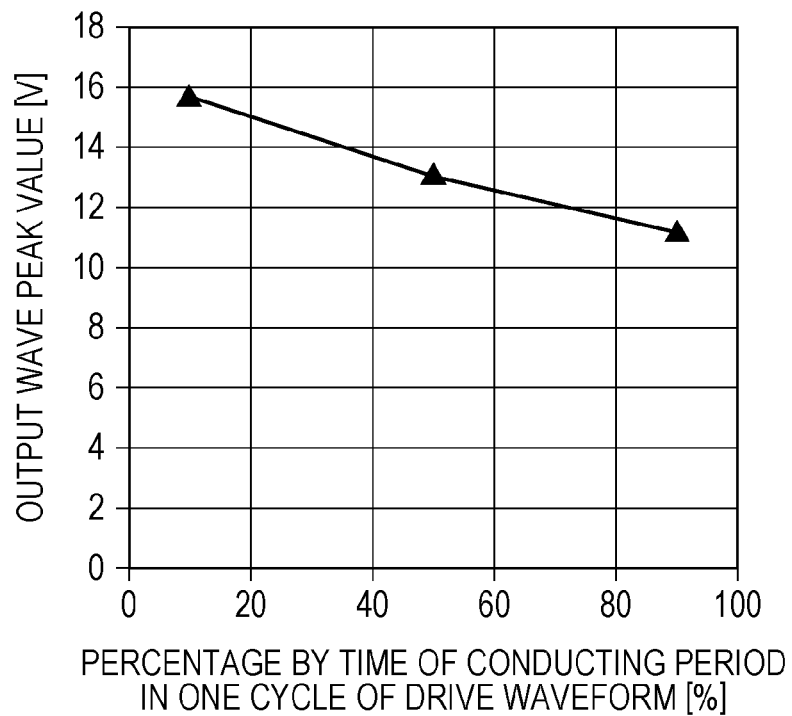
FIG. 8 is a diagram illustrating a comparative example according to the second embodiment.

FIG. 8 is a diagram illustrating simulation results of output wave peak values according to difference in conducting time (difference in duty). A 1-µF capacitor was used in the present comparative example as the capacitor 50. It can be seen from FIG. 8 that the output wave peak value differs in the configuration of the comparative example according to difference in duty. Accordingly, output fluctuation occurring due to imbalance in charge consumption will occur in cases of performing different PWM driving at different times.

Figure 9:
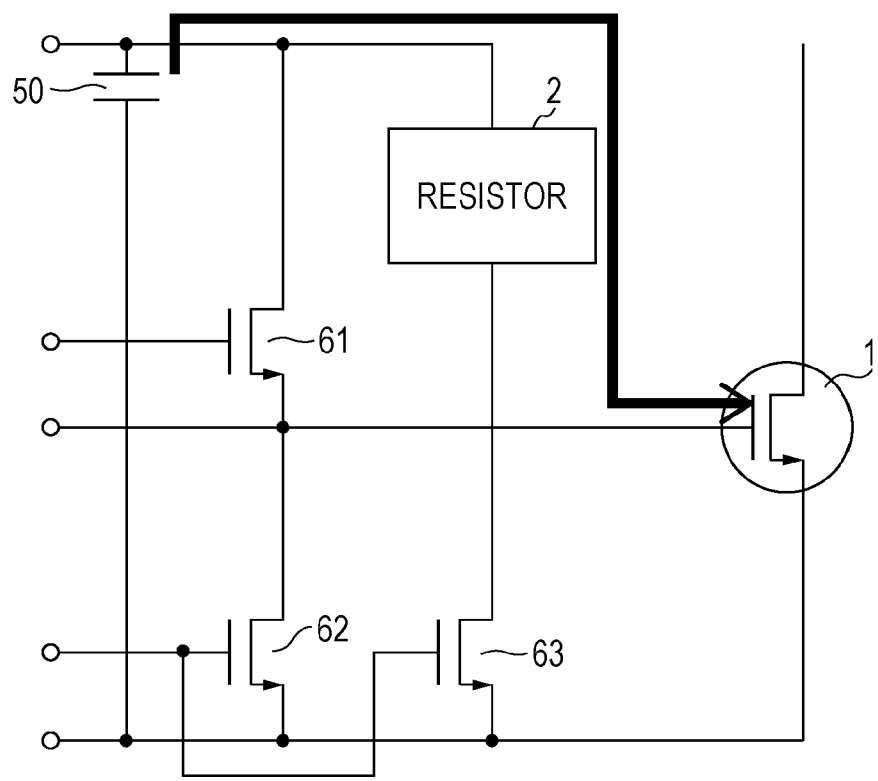
FIG. 9 is a diagram illustrating an example of a circuit making up the drive device according to the second embodiment.

FIG. 9 is a diagram illustrating an example of a circuit making up the drive device according to the second embodiment. The configuration illustrated in FIG. 9 will now be described in detail. The third switching device 63 which controls consumption of the stored charge is controlled by the same signal as the control signal controlling the second switching device 62 that forms the half bridge circuit. The resistor 2 is a limiting resistor to decide the amount of charge consumed.

Figure 10A:
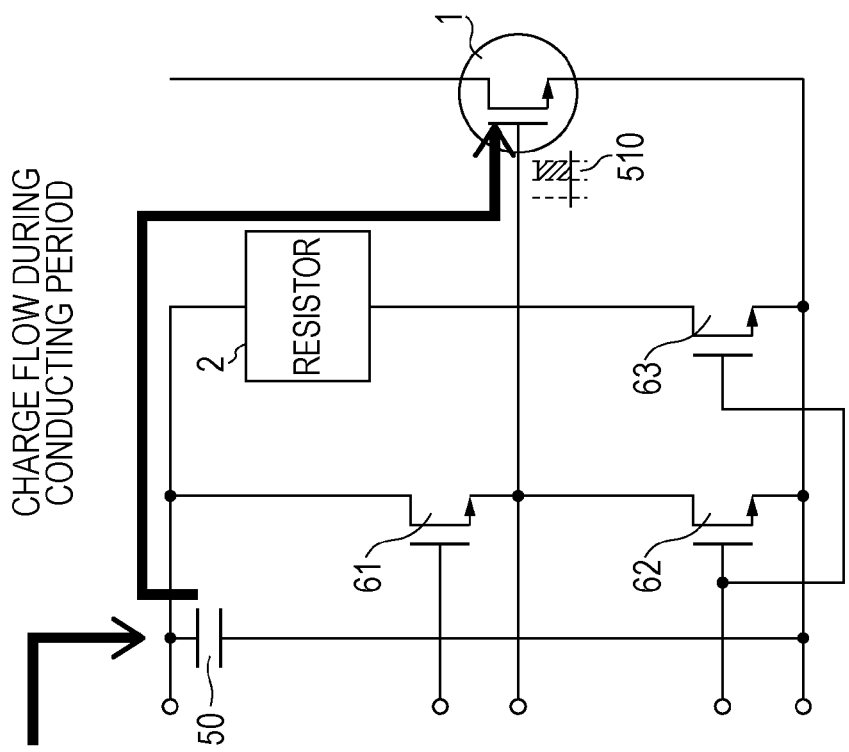
FIGS. 10A and 10B are diagrams illustrating drive waveforms and charge flow during a conducting period.
Figure 10B:
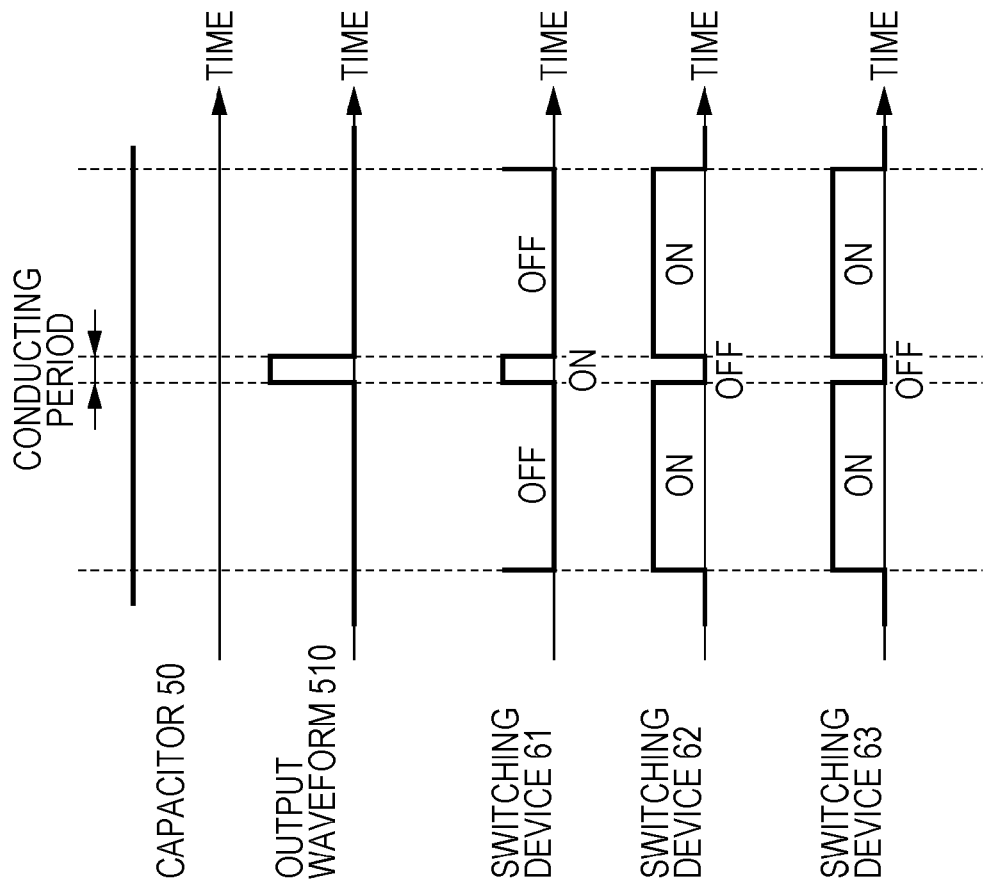
Figure 11A:
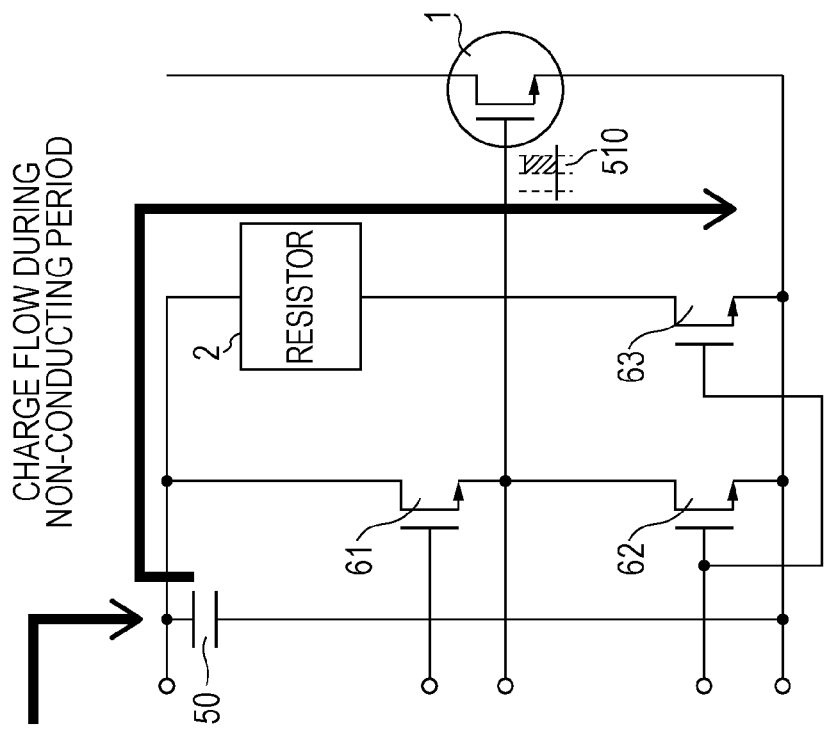
FIGS. 11A and 11B are diagrams illustrating drive waveforms and charge flow during a non-conducting period.
Figure 11B:
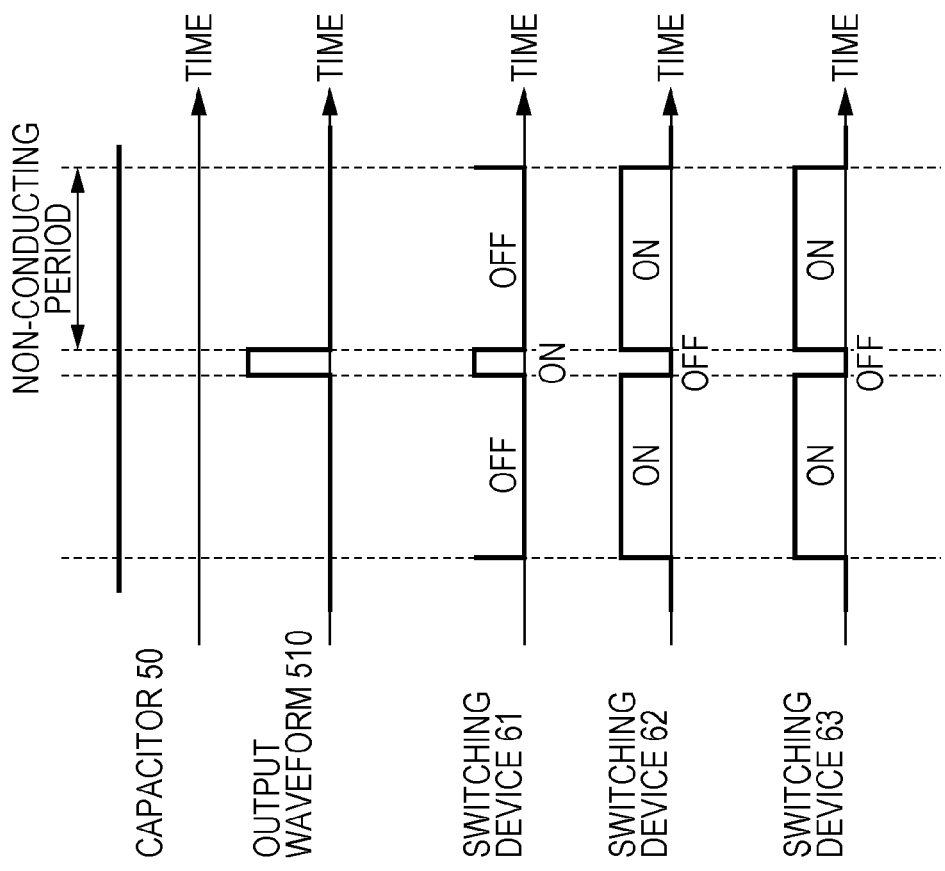
Figure 13A:
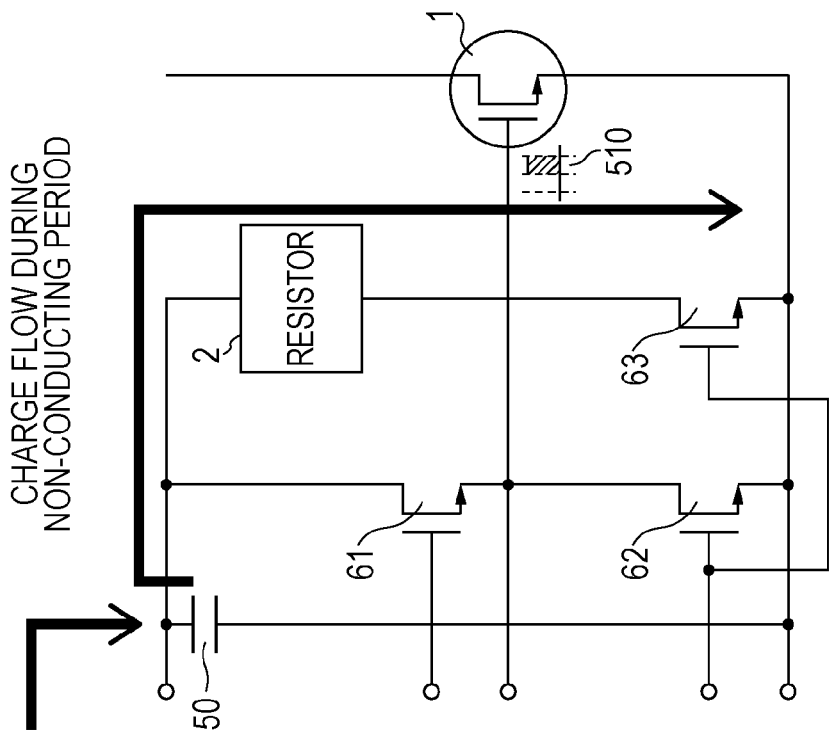
FIGS. 13A and 13B are diagrams illustrating drive waveforms and charge flow during a non-conducting period.
Figure 13B:
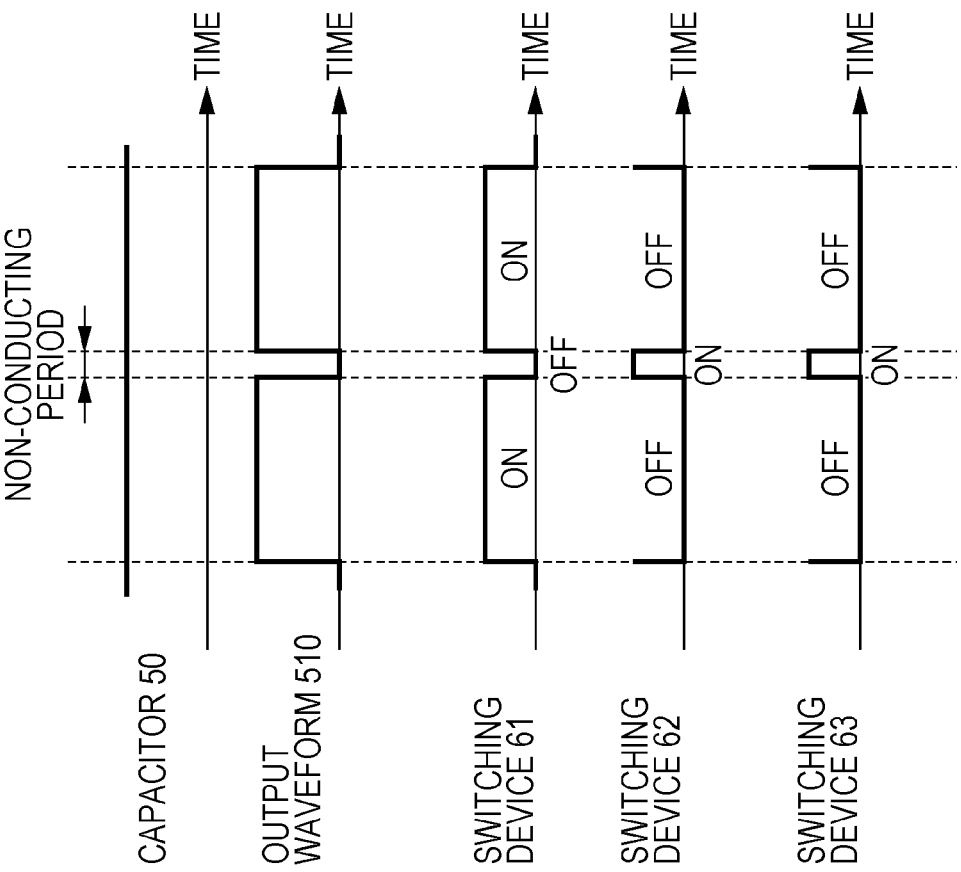

FIGS. 10A and 10B are diagrams illustrating the driving waveform and the flow of charge during the conducting period in the circuit in FIG. 9, in a case where the conducting period (supply period) is short. FIGS. 11A and 11B are diagrams illustrating the driving waveform and the flow of charge during the non-conducting period (non-supply period) in the circuit in FIG. 9, in a case where the conducting period is short. FIGS. 12A and 12B are diagrams illustrating the driving waveform and the flow of charge during the conducting period in the circuit in FIG. 9, in a case where the conducting period is long. FIGS. 13A and 13B are diagrams illustrating the driving waveform and the flow of charge during the non-conducting period in the circuit in FIG. 9, in a case where the conducting period is long.

Figure 14:
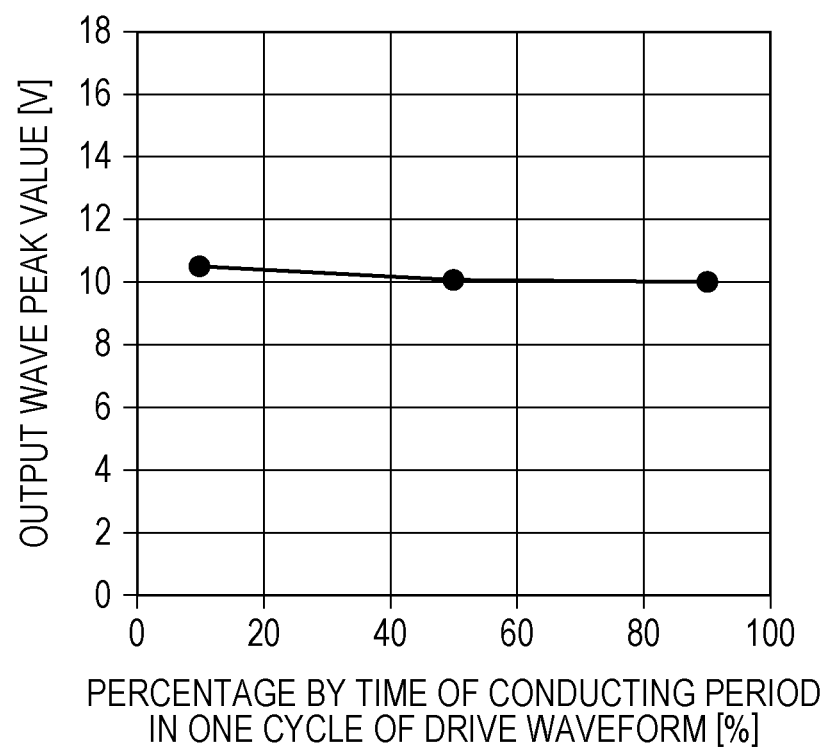
FIG. 14 is a diagram illustrating results of simulating output wave peak value according to difference in conducting periods (difference in duty) in the drive device according to the second embodiment.

FIG. 14 is a diagram illustrating simulation results of output wave peak values according to difference in conducting time (difference in duty) in the drive device according to the second embodiment. A 1-µF capacitor was used in the present comparative example as the capacitor 50, and a 60 kΩ resistor was used as the resistor 2.

Now, in a case where the non-conducting period is short, the effect of adjusting the output wave peak value is small in comparison with a case where the conducting period is short, since the charge in the capacitor is consumed during the non-conducting period. It can be seen from FIG. 14 that occurrence in output fluctuation as to the ratio by time of the conducting period in one cycle of the driving waveform has been reduced in comparison with FIG. 8.

Thus, the third switching device 63 is controlled by the same control signal as the second switching device 62 during the non-conducting period in the drive device according to the second embodiment. Accordingly, occurrence of output fluctuation due to imbalance in charge consumption due to difference in conducting periods can be suppressed by consuming the charge of the capacitor during the non-conducting period.

Figure 15:
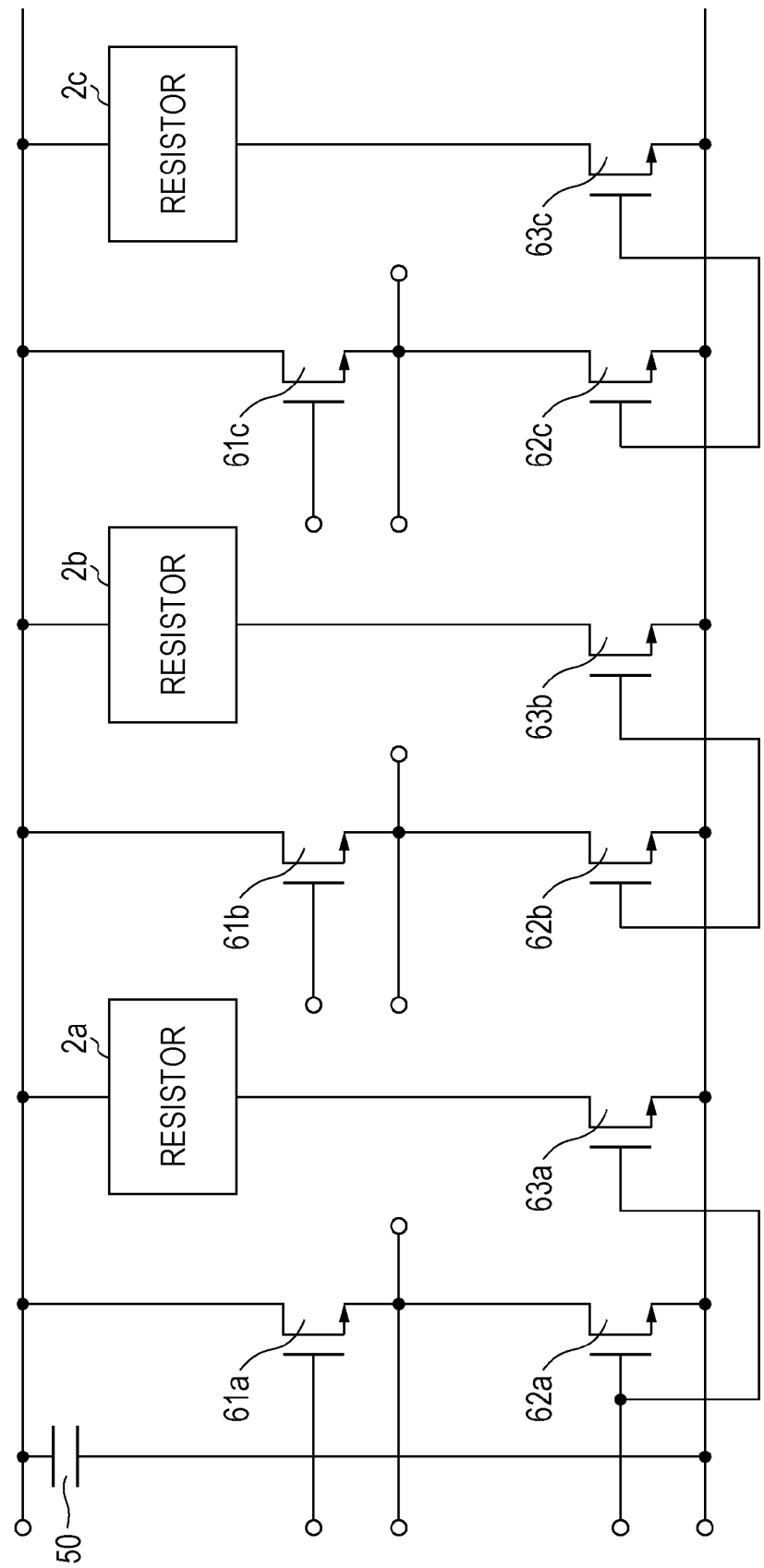
FIG. 15 is a diagram illustrating an example of a drive device having multiple gate drive circuits.

Note that the capacitor 50 may supply charge to multiple gate drive circuits. FIG. 15 is a diagram illustrating an example of a drive device having multiple gate drive circuits. The driving state of the multiple gate drive circuits may not be the same in the configuration illustrated in FIG. 15. In this case, imbalance occurs in the charge consumption between the conducting period and non-conducting period, resulting in occurrence of output fluctuation. The drive device according to the second embodiment can suppress imbalance in charge consumption, and accordingly output fluctuation can be suppressed even in a case of one capacitor 50 supplying charge to multiple gate drive circuits.

Third Embodiment

A drive device according to a third embodiment includes, in addition to the configuration of the drive device according to the first embodiment described above, the following configuration. That is to say, the drive device according to the third embodiment includes a charge unit that charges charge to the capacitor. The charge consumption unit consumes charge of the capacitor during a period from the charge unit starting charging the charge to the capacitor till the charge charged to the capacitor is supplied to the conduction control terminal of the semiconductor switching device by the output selection unit. This configuration enables occurrence of excessive voltage or excessive current to be suppressed when starting driving or the like, for example.

FIGS. 16A and 16B are diagrams illustrating an example of a circuit of the drive device according to the third embodiment, and drive waveforms. FIG. 16A illustrates the state of transition from a standby state, such as having turned on the power, until driving stabilizes. The third switching device 63 in FIG. 16B is a transistor that controls consumption of the stored charge, and the resistor 2 is a limiting resistor to decide the amount of charge consumed.

The third switching device 63 serves to consume the charge from the capacitor 50 by being controlled by a driving waveform such as illustrated in FIG. 16A from the standby state till starting driving. In the standby state, the output signal is maintained at the OFF state by the control signals for the first switching device 61 being OFF and the control signal for the second switching device 62 being ON.

Figure 17B:
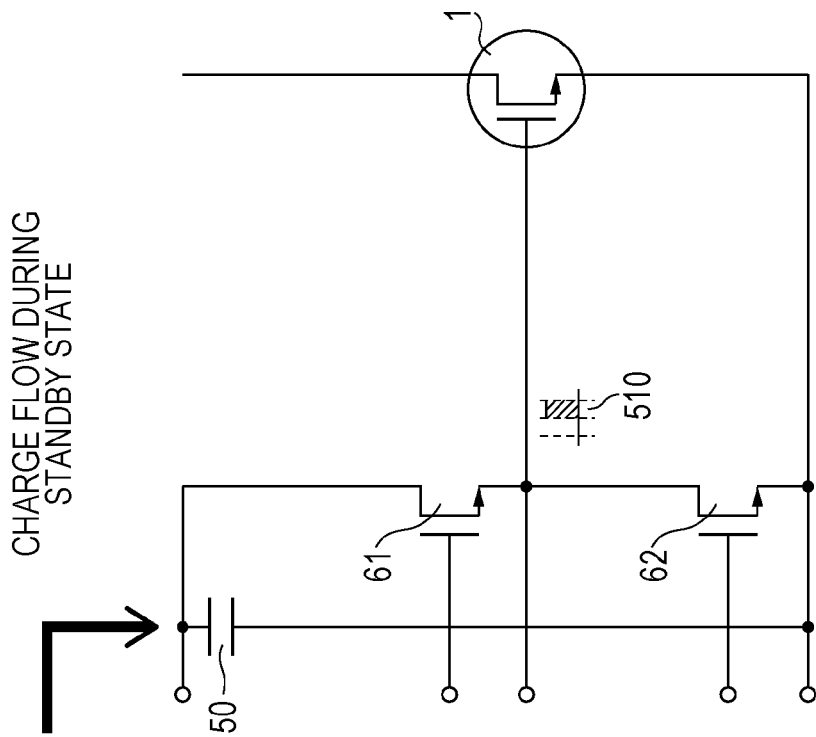
FIGS. 17A and 17B are diagrams illustrating drive waveforms of a comparative example.
Figure 17A:
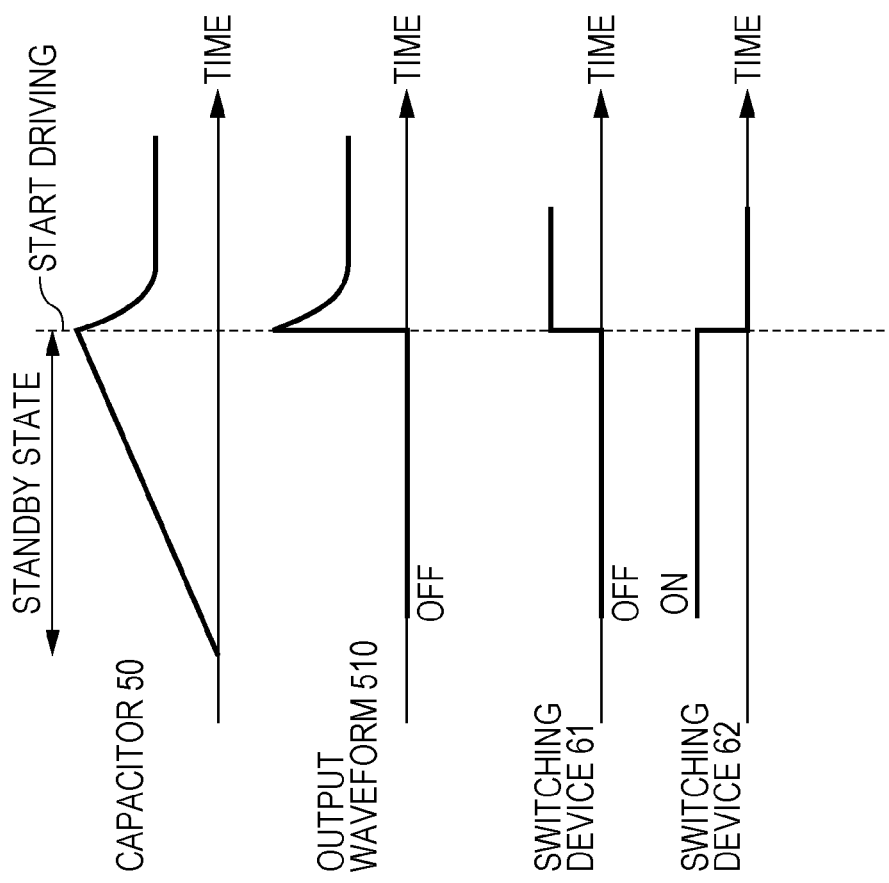

FIGS. 17A and 17B illustrate drive waveforms of a comparative example. The capacitor 50 continues to be charged during the standby state, as illustrated in FIGS. 17A and 17B. Accordingly, the potential of the capacitor 50 rises to the highest point. Thereafter, excessive voltage or excessive current could have transiently occurred at the conduction control terminal (gate terminal or base terminal) of the semiconductor switching device 1 until the output waveform 510 stabilizes after starting driving. However, the drive device according to the third embodiment can suppress the potential of the capacitor 50 from rising before starting driving, by consuming charge during the standby state. Accordingly, occurrence of excessive voltage or excessive current when starting driving can be reduced.

Fourth Embodiment

A drive device according to a fourth embodiment includes, in addition to the configuration of the drive device according to the first embodiment described above, the following configuration. That is to say, the drive device according to the fourth embodiment is arranged such that the third switching device 63 is in a conducting state during a period when the first switching device 61 is in a conducting state and the second switching device 62 is in a non-conducting state. This configuration enables the output of the drive device to be made to approach 0, using the time constant of the capacitor 50 and resistor 2. Accordingly, occurrence of surge voltage at the semiconductor switching device 1 can be reduced.

The drive device according to the fourth embodiment may also include a charge unit that charges a charge to the capacitor. During the period when the first switching device 61 is in a conducting state and the second switching device 62 is in a non-conducting state, the driving device according to the fourth embodiment may stop charging of the charge to the capacitor 50 by the charge unit. The driving device according to the fourth embodiment may also set the third switching device 63 to the conducting state at the timing of stopping charging of the charge to the capacitor 50 by the charge unit.

Figure 18A:
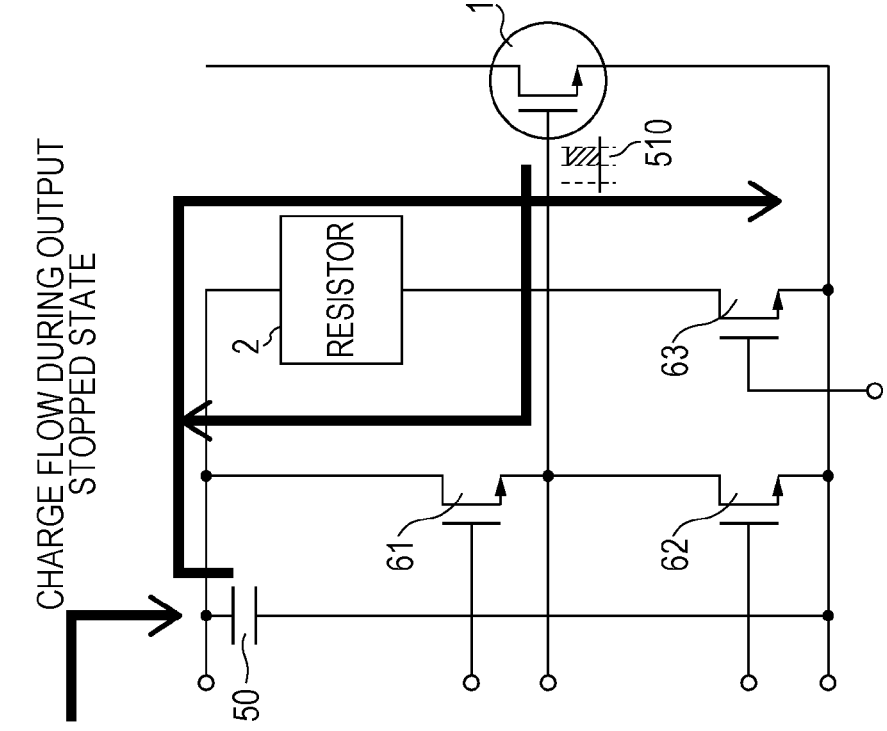
FIGS. 18A and 18B are diagrams for describing an output stopped state in a drive device according to a fourth embodiment.
Figure 18B:
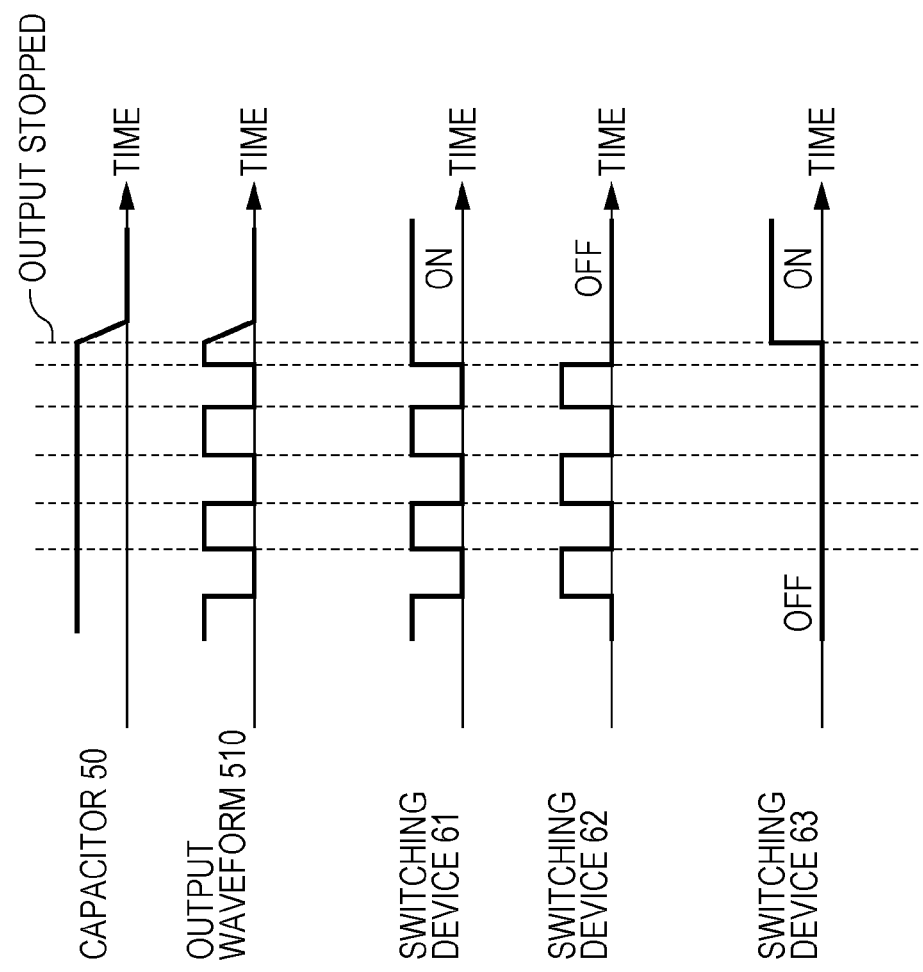

FIGS. 18A and 18B are diagrams for describing an output stopped state of the drive device according to the fourth embodiment, including illustrating of drive waveforms. The fourth embodiment is an example of realizing operations of a protection circuit. Protection operations are operations where, in a case that excessive voltage or excessive current at a power circuit block such as an inverter or the like, including the semiconductor switching device 1, has caused a system abnormality, this state is detected and the output waveform 510 of the gate drive circuit is stopped.

Figure 19A:
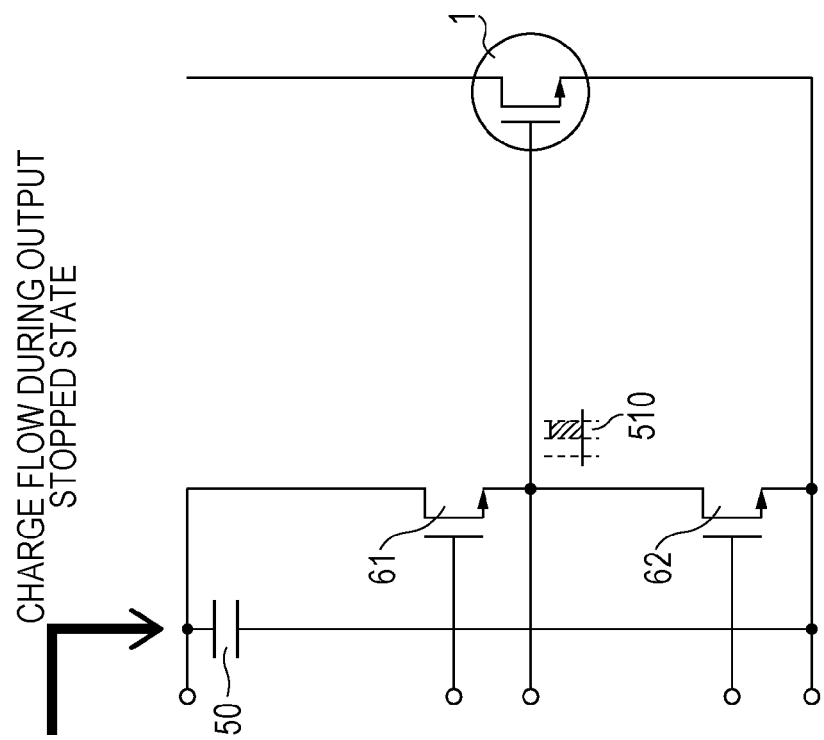
FIGS. 19A and 19B are diagrams illustrating drive waveforms of a comparative example.
Figure 19B:
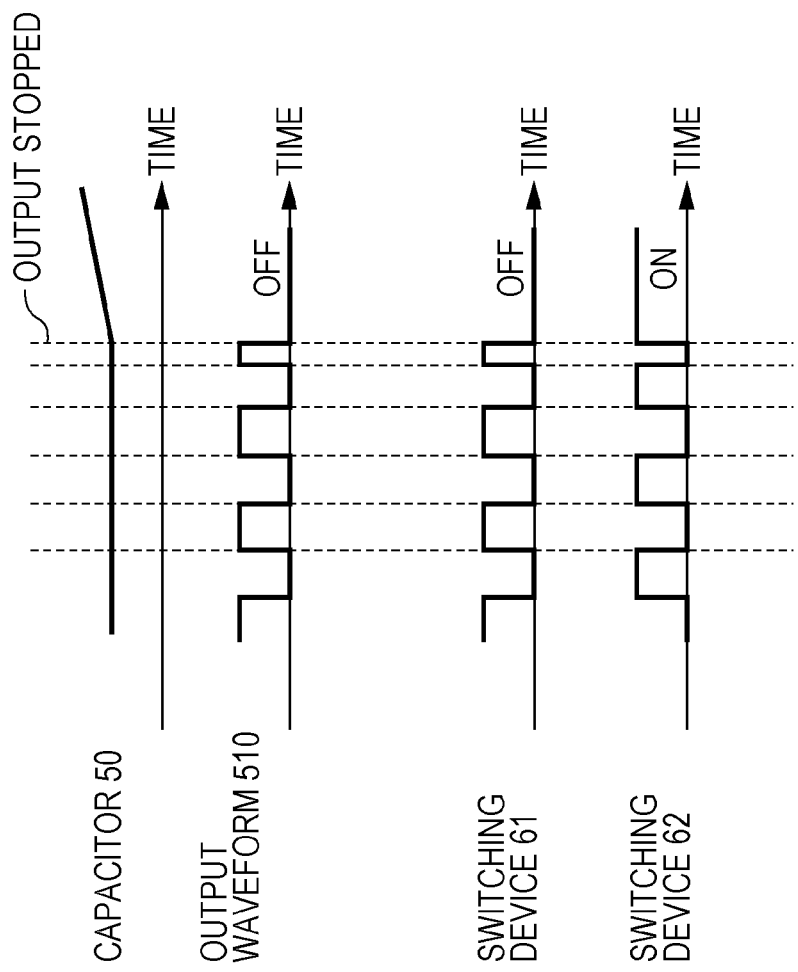

FIGS. 19A and 19B are diagrams illustrating drive waveforms of a comparative example. The output waveform 510 of the gate drive circuit is stopped in the comparative example illustrated in FIG. 19 by setting the control signals for the first switching device 61 to OFF and the control signal for the second switching device 62 to ON. In this case, the charge continues to be stored in the capacitor 50, as can be seen from FIGS. 19A and 19B. Thus, charge is not consumed, so the potential of the capacitor 50 rises, as in the above-described operation.

On the other hand, the drive device according to the fourth embodiment consumes charge of the capacitor 50 via the resistor 2 by setting the control signals for the first switching device 61 to ON and the control signal for the second switching device 62 to OFF, and further controlling the third switching device 63. Accordingly, the potential of the capacitor 50 can be lowered to the reference level at the same time as stopping the output waveform 510, and the system can be maintained in a safer state.

The drive device according to the fourth embodiment can stop the output waveform 510 using the time constant of the capacitor 50 and resistor 2. Accordingly, occurrence of surge voltage at the semiconductor switching device 1 can be suppressed, thereby suppressing damage to the semiconductor switching device 1 by the protecting operations.

Fifth Embodiment

A drive device according to a fifth embodiment includes, in addition to the configuration of the drive device according to the first embodiment described above, the following configuration. That is to say, the drive device according to the fifth embodiment further includes an electromagnetic resonance coupler X and a rectifying unit including a rectifier circuit. High-frequency waves are transmitted by isolated transmission by the electromagnetic resonance coupler X, and then rectified by the rectifying unit, thereby generating charging voltage. The capacitor is charged by this charging voltage. This configuration enables constant charging voltage to be supplied to the capacitor for example, by rectifying high-frequency waves to yield charging voltage. Accordingly, the amount of the charge stored in the capacitor can be precisely adjusted by consumption of the charge by the charge consumption unit.

The drive device according to the fifth embodiment may further include an electromagnetic resonance coupler Y. Modulated signals obtained by modulating the high-frequency waves in accordance with input signals may be transmitted by isolated transmission by the electromagnetic resonance coupler Y and rectified by the rectifying unit, thereby generating control signals. The output selection unit may select whether or not to supply the charge of the capacitor to the conduction control terminal of the semiconductor switching device 1 depending on the control signal at this time. This configuration enables a large current to be supplied to the semiconductor switching device 1. Further, high-frequency waves used to generate the charging voltage can also be used for controlling the output selection unit.

An example of the drive device according to the fifth embodiment will be described in detail with reference to FIGS. 20 and 21. Examples of the rectifier circuit are illustrated as a first rectifier circuit 40*a*, a second rectifier circuit 40*b*, and a third rectifier circuit 40*c*. An electromagnetic resonance coupler 20*c* is exemplarily illustrated as the electromagnetic resonance coupler X, and an electromagnetic resonance coupler 20*a* and an electromagnetic resonance coupler 20*b* are exemplarily illustrated as the electromagnetic resonance coupler Y.

Figure 20:
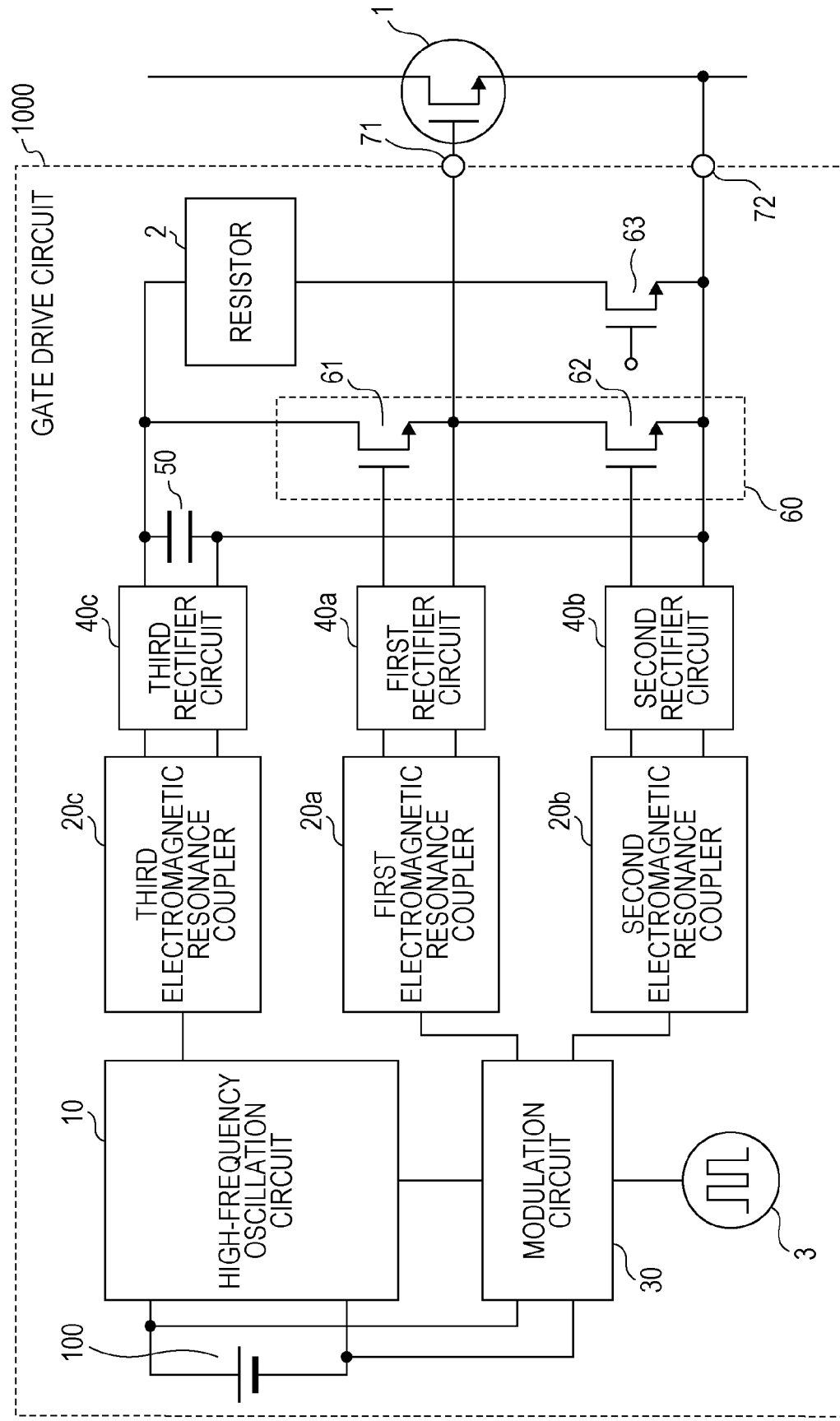
FIG. 20 is a diagram illustrating a schematic configuration of a gate drive circuit of a drive device according to a fifth embodiment.

FIG. 20 is a diagram illustrating a schematic configuration of the gate drive circuit 1000 which is the drive device according to the fifth embodiment. FIG. 21 is a circuit diagram illustrating a specific configuration example of the gate drive circuit 1000 illustrated in FIG. 20.

A gate drive circuit 1000 includes a DC power source 100 and a signal generator 3. The gate drive circuit 1000 also includes a high-frequency oscillation circuit 10, a modulation circuit 30, a first electromagnetic resonance coupler 20*a*, a second electromagnetic resonance coupler 20*b*, and a third electromagnetic resonance coupler 20*c*. The gate drive circuit 1000 also includes a first rectifier circuit 40*a*, a second rectifier circuit 40*b*, a third rectifier circuit 40*c*, a capacitor 50, a half bridge circuit 60, an output terminal 71, and an output reference terminal 72. Note that the capacitor 50 is a capacitive device for example, and is not parasitic capacitance. The capacitor 50 is an element having capacitance of 10 pF or larger, for example.

The half bridge circuit 60 is configured including a first switching device 61 and a second switching device 62, for example, in the first embodiment. The first switching device 61 and second switching device 62 may be transistors, for example.

A DC power source 100 is a power source which supplies power so that the high-frequency oscillation circuit 10 and modulation circuit 30 can operate, for example. While FIG. 20 illustrates the DC power source 100 as being provided within the gate drive circuit 1000, this may be provided externally from the gate drive circuit 1000. That is to say, the gate drive circuit 1000 does not have to have the DC power source 100.

The signal generator 3 generates input signals, and outputs to the modulation circuit 30. The input signals are equivalent to control signals, and driving signals to drive the semiconductor switching device 1 are generated based on the control signals. The signal generator 3 is made up of a logic IC, for example. The input signals are binary signals of high level and low level, as can be seen from waveform 501 and waveform 502 in FIG. 21.

The input signals may be made up of a first input signal and second input signal. In the example illustrated in FIG. 21, the waveform 501 is the first input signal, and the waveform 502 is the second input signal. The first input signal includes a first low-level voltage, and a first high-level voltage larger than the first low-level voltage, for example. The second input signal includes a second low-level voltage, and a second high-level voltage larger than the second low-level voltage, for example. The second input signal may exhibit second low-level voltage during a period in which the first input signal exhibits first high-level voltage. The first input signal may exhibit first low-level voltage during a period in which the second input signal exhibits second high-level voltage. The second input signal may be a signal obtained by inverting the first input signal. For example, the second input signal may be a signal obtained by inverting the first input signal at an intermediate value between the first high-level voltage and the second high-level voltage as a reference. In this case, the first input signal and the second input signal may be in a complementary relation, as illustrated in FIG. 21. The first low-level voltage and/or second low-level voltage may be 0 V, for example.

Figure 21:
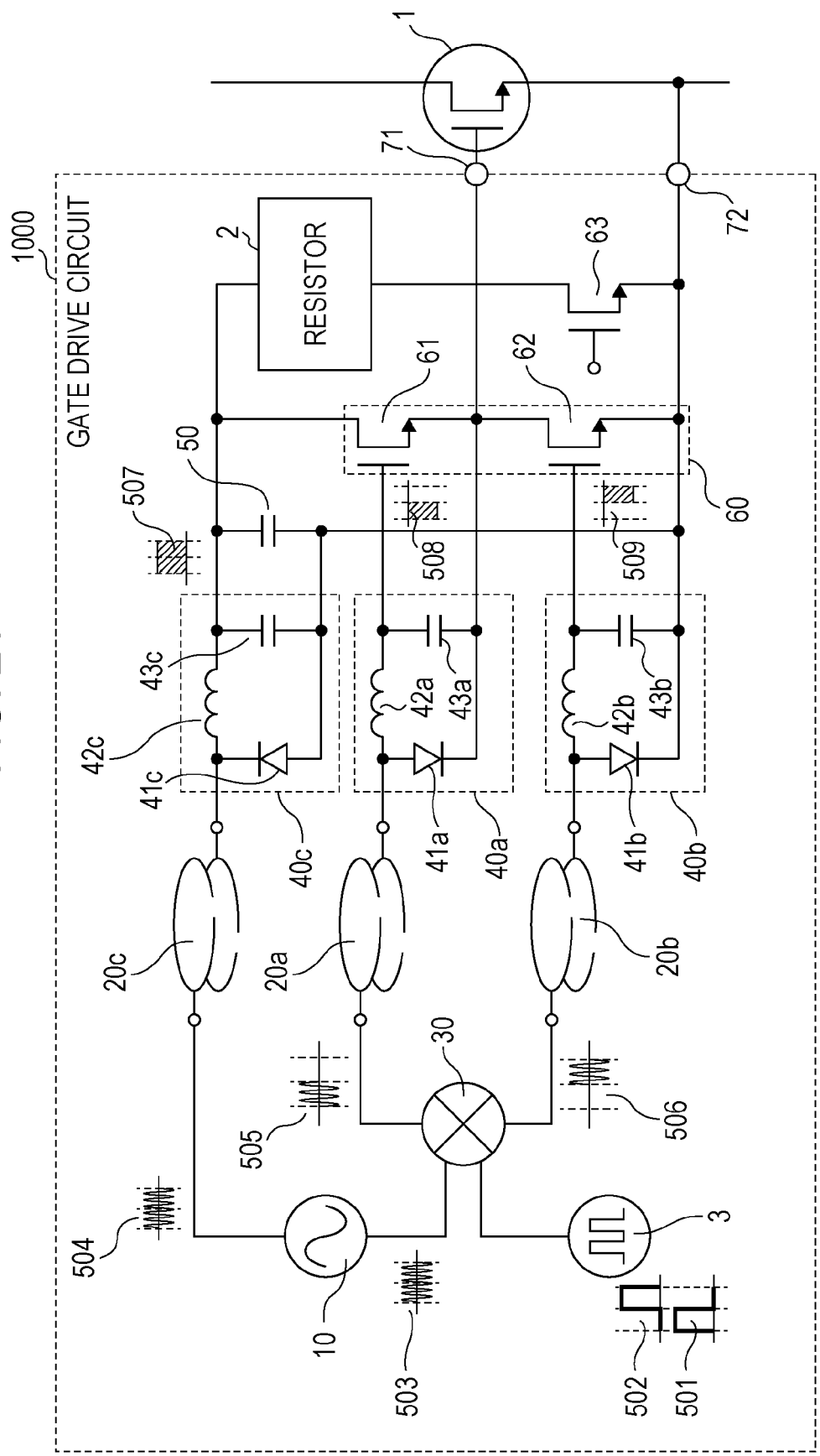
FIG. 21 is a circuit diagram illustrating a specific configuration example of the gate drive circuit illustrated in FIG. 20.

While the signal generator 3 is provided within the gate drive circuit 1000 in FIG. 20 and FIG. 21, this may be provided eternally from the gate drive circuit 1000. In this case, the gate drive circuit 1000 has a first input terminal to which input signals are input. That is to say, the gate drive circuit 1000 does not have to have the signal generator 3.

The high-frequency oscillation circuit 10 generates high-frequency waves. The high-frequency waves may be microwave power. The high-frequency waves serve to transmit electric power. The high-frequency oscillation circuit 10 has at least two output systems. The high-frequency oscillation circuit 10 outputs the generated high-frequency waves to the modulation circuit 30 and the third electromagnetic resonance coupler 20*c*. The high-frequency waves have waveforms such as those of the waveform 503 and waveform 504 illustrated in FIG. 21. The frequency of the high-frequency waves may be 2.4 GHz or 5.8 GHz which are ISM bands available for unlicensed use if output is low, or may be other frequencies. The high-frequency oscillation circuit 10 specifically may be a Colpitts oscillator, a Hartley oscillator, or some other oscillator which generates microwaves. The high-frequency oscillation circuit 10 may include a frequency adjusting mechanism for cases where the frequency of high-frequency waves fluctuates. Note that the high-frequency waves generated by the high-frequency oscillation circuit 10 have a certain amplitude and a certain frequency, for example.

In the present disclosure, high-frequency waves modulated by the first input signals and/or the second input signals, that is to say high-frequency waves which are carrier waves for the first input signals and/or the second input signals, may be referred to as first high-frequency waves, and high-frequency waves for supplying electric power for charging may be referred to as second high-frequency waves. In the example illustrated in FIG. 21, the waveform 503 represents the first high-frequency waves and the waveform 504 represents the second high-frequency waves. Note that the second high-frequency waves are input to the third electromagnetic resonance coupler in the first embodiment. In this case, the second high-frequency waves may have a certain amplitude, or may have multiple amplitudes. That is to say, the second high-frequency waves may have signal components based on multiple different amplitudes. The first high-frequency waves and the second high-frequency waves may have the same amplitude, or may have different amplitudes. It should be noted, however, in a case where the second high-frequency waves have a greater amplitude than the first high-frequency waves, the amount of charge which is charged to the capacitor can be increased, which will be described later. The first high-frequency waves and the second high-frequency waves may have the same frequency, or may have different frequencies.

Note that in FIGS. 20 and 21, the high-frequency oscillation circuit 10 is provided within the gate drive circuit 1000, but may be provided externally from the gate drive circuit 1000. In this case, the gate drive circuit 1000 has a second input terminal to which high-frequency waves are input. That is to say, the gate drive circuit 1000 may have the high-frequency oscillation circuit 10. The high-frequency oscillation circuit 10 may be included in a high-frequency wave generator, as described later.

The modulation circuit 30 generates first modulated signals by modulating high-frequency waves in accordance with first input signals output from the signal generator 3, and outputs the first modulated signals to the first electromagnetic resonance coupler 20a. In a case where the modulation circuit 30 is a frequency mixer such as illustrated in FIG. 21, the modulation circuit 30 mixes the first input signals and the high-frequency waves to generate the first modulated signals. The first modulated signals have a waveform such as represented by waveform 505 in FIG. 21, for example.

Further, the modulation circuit 30 generates second modulated signals by modulating high-frequency waves in accordance with second input signals output from the signal generator 3 which are different from the first input signals, and outputs the second modulated signals to the second electromagnetic resonance coupler 20b. Specifically, in a case where the modulation circuit 30 is a frequency mixer such as illustrated in FIG. 21, the modulation circuit 30 mixes the second input signals and the high-frequency waves to generate the second modulated signals. The second modulated signals have a waveform such as represented by waveform 506 in FIG. 21, for example. In a case where the second input signals are signals obtained by inverting the first input signals, the first modulated signals and the second modulated signals are in a complementary relationship.

The first modulated signals include a first amplitude, and a second amplitude which is larger than the first amplitude, for example. The first amplitude of the first modulated signals corresponds to the first low-level voltage of the first input signals for example, and the second amplitude of the first modulated signals corresponds to the first high-level voltage of the first input signals, for example. The second modulated signals include a third amplitude, and a fourth amplitude which is larger than the third amplitude, for example. The third amplitude of the second modulated signals corresponds to the second low-level voltage of the second input signals for example, and the fourth amplitude of the second modulated signals corresponds to the second high-level voltage of the second input signals, for example. The second modulated signals may exhibit the third amplitude in a period where the first modulated signals exhibit the second amplitude. The first modulated signals may exhibit the first amplitude in a period where the second modulated signals exhibit the fourth amplitude. The first amplitude and third amplitude, and/or the second amplitude and fourth amplitude, may be the same value. The first amplitude and/or the third amplitude may be zero.

While the first modulated signals and the second modulated signals have been described as being in a complementary relationship in the example illustrated in FIG. 21, the input signals may be other waveforms which are more optimal. In the example illustrated in FIG. 21, the modulation circuit 30 is a frequency mixer, and more specifically is a so-called differential mixer.

The first electromagnetic resonance coupler 20a performs isolated transmission of the first modulated signals generated by the modulation circuit 30. The second electromagnetic resonance coupler 20b performs isolated transmission of the second modulated signals generated by the modulation circuit 30. The third electromagnetic resonance coupler 20c performs isolated transmission of the high-frequency waves generated by the high-frequency oscillation circuit 10.

The first rectifier circuit 40a generates first signals, which are control signals, by rectifying the first modulated signals transmitted from the first electromagnetic resonance coupler 20a by isolated transmission. The first rectifier circuit 40a is configured including a diode 41a, inductor 42a, and capacitor 43a. The first signals have a waveform such as the waveform 508 in FIG. 21. The first signals are output from the first rectifier circuit 40a, and are input to the gate terminal of the first switching device 61, for example.

The second rectifier circuit 40b generates second signals, which are control signals, by rectifying the second modulated signals transmitted from the second electromagnetic resonance coupler 20b by isolated transmission. The second rectifier circuit 40b is configured including a diode 41b, inductor 42b, and capacitor 43b. The second signals have a waveform such as the waveform 509 in FIG. 21. The second signals are output from the second rectifier circuit 40b, and are input to the gate terminal of the second switching device 62, for example.

The first signals include, for example, a first off voltage, and a first on voltage which is different from the first off voltage. In a case where the first switching device 61 is an N-type transistor, the first on voltage is larger than the first off voltage. In a case where the first switching device 61 is a P-type transistor, the first on voltage is smaller than the first off voltage. In a case where the first switching device 61 is a normally-off transistor, the first off voltage of the first signals corresponds to the first amplitude of the first modulated signals for example, and the first on voltage of the first signals corresponds to the second amplitude of the first modulated signals. In this case, the first off voltage of the first signals corresponds to the first low-level voltage of the first input signals for example, and the first on voltage of the first signals corresponds to the first high-level voltage of the first input signals for example. In a case where the first switching device 61 is a normally-on transistor, the first off voltage of the first signals corresponds to the second amplitude of the first modulated signals for example, and the first on voltage of the first signals corresponds to the first amplitude of the first modulated signals. In this case, the first off voltage of the first signals corresponds to the first high-level voltage of the first input signals for example, and the first on voltage of the first signals corresponds to the first low-level voltage of the first input signals for example.

The second signals include, for example, a second off voltage, and a second on voltage which is different from the second off voltage. In a case where the second switching device 62 is an N-type transistor, the second on voltage is larger than the second off voltage. In a case where the first switching device 61 is a P-type transistor, the second on voltage is smaller than the second off voltage. In a case where the first switching device 61 is a normally-off transistor, the second off voltage of the second signals corresponds to the third amplitude of the second modulated signals for example, and the second on voltage of the second signals corresponds to the fourth amplitude of the second modulated signals, for example. In this case, the second off voltage of the second signals corresponds to the second low-level voltage of the second input signals for example, and the second on voltage of the second signals corresponds to the second high-level voltage of the second input signals for example. In a case where the second switching device 62 is a normally-on transistor, the second off voltage of the second signals corresponds to the fourth amplitude of the second modulated signals for example, and the second on voltage of the second signals corresponds to the third amplitude of the second modulated signals, for example. In this case, the second off voltage of the second signals corresponds to the second high-level voltage of the second input signals for example, and the second on voltage of the second signals corresponds to the second low-level voltage of the second input signals for example.

The second signals may exhibit the second off voltage in a period in which the first signals exhibit the first on voltage. The first signals may exhibit the first off voltage in a period in which the second signals exhibit the second on voltage. The first signals and second signals may be in a complementary relationship, or may be in some other relationship. The first off voltage and the second off voltage, and/or the first on voltage and the second on voltage, may be the same value.

In the following description, will be made regarding a case where the first switching device 61 and second switching device 62 are normally-on and N-type transistors, unless specifically stated otherwise. Specifically, an example will be described where the first on voltage and second on voltage are zero, and the first off voltage and second off voltage are a negative value, as illustrated in FIG. 21.

The third rectifier circuit 40c generates third signals by rectifying the second high-frequency waves transmitted by isolated transmission from the third electromagnetic resonance coupler 20c. The third signals are signals of a waveform such as waveform 507 in FIG. 21. The third rectifier circuit 40c charges the capacitor 50 with the generated third signals. The third signals have a DC voltage component.

As illustrated in FIG. 21, the third signals may be a constant voltage value. In other words, the third signals do not have to be configured from multiple voltage values. That is to say, the third signals do not have to include a signal component. It is sufficient for the third signals to have power to charge the capacitor. Voltage for charging the capacitor may be referred to as "charging voltage" in the present disclosure. The third signals may be made up of the charging voltage alone, as illustrated in FIG. 21, or may include the charging voltage and also another voltage smaller than the charging voltage. The charging voltage may be larger than the first on voltage of the first signals and the second on voltage of the second signals. In this case, the charge amount charged to the capacitor is greater. The third signals may exhibit charging voltage in a period in which the second signals exhibit the second on voltage, and further, the third signals may exhibit charging voltage in a period in which the first signals exhibit the first on voltage, as illustrated in FIG. 21.

Now, a configuration example of a rectifier circuit 40 will be described in detail. The rectifier circuit 40 may be used as the first rectifier circuit 40a, the second rectifier circuit 40b, and the third rectifier circuit 40c. A specific example of the third rectifier circuit 40c will be described below as an example of the rectifier circuit 40. Note however, that the specific example described below may also be similarly applied to the first rectifier circuit 40a and the second rectifier circuit 40b.

The third rectifier circuit 40c is configured including a diode 41c, inductor 42c, and capacitor 43c. In the third rectifier circuit 40c, one terminal of the inductor 42c is connected to one terminal of the diode 41c, the other terminal of the inductor 42c is connected to one terminal of the capacitor 43c, and the other terminal of the diode 41c and the other terminal of the capacitor 43c are connected to the output reference terminal of the third rectifier circuit 40c. The point of contact of the one terminal of the inductor 42c and the one terminal of the diode 41c functions as an input terminal of the third rectifier circuit 40c, and the point of contact of the other terminal of the inductor 42c and the one terminal of the capacitor 43c functions as an output terminal of the third rectifier circuit 40c.

The cathode of the diode 41c is connected to the input terminal of the third rectifier circuit 40c in the example illustrated in FIG. 21. Accordingly, the third rectifier circuit 40c rectifies the positive voltage component of the second high-frequency waves. On the other hand, the anode of the diode 41a is connected to the input terminal of the first rectifier circuit 40a, and the anode of the diode 41b is connected to the input terminal of the second rectifier circuit 40b. Accordingly, the first rectifier circuit 40a and the second rectifier circuit 40b rectify the negative voltage component of the modulated signals. Whether the voltage component which the rectifier circuits rectify is positive or negative is not restricted in particular. The polarity of these may be set as appropriate in accordance with the properties of the half bridge circuit 60. For example, the polarity of these may be set as appropriate in accordance with whether the first switching device 61 and second switching device 62 making up the half bridge circuit 60 are normally-on or normally-off, and whether N-type or P-type.

Now, the output terminal of the third rectifier circuit 40c is adjusted by the inductor 42c and capacitor 43c to be at the short-circuit point of the frequency of the high-frequency waves. Accordingly, the high-frequency waves input from the input terminal of the third rectifier circuit 40c are reflected near the output terminal of the third rectifier circuit 40c. Thus, the amplitude (voltage value) of high-frequency waves at the input terminal of the third rectifier circuit 40c is approximately twice the amplitude (voltage value) of the original high-frequency waves input from the third electromagnetic resonance coupler 20c. This configuration enables high-frequency waves to be efficiently rectified by a single diode 41c. Note that even if the output terminal of the third rectifier circuit 40c is not precisely the short-circuit point of the frequency of the high-frequency waves, highly efficient rectification can be performed as long as the third rectifier circuit 40c operates as a low-pass filter of a predetermined frequency.

The half bridge circuit 60 includes the first switching device 61 and the second switching device 62. The first switching device 61 supplies the charge charged to the capacitor 50 to the gate terminal of the semiconductor switching device 1 in accordance with the first signal. The second switching device 62 extracts the charge at the gate terminal of the semiconductor switching device 1 in accordance with the second signal.

The first switching device 61 supplies the charge charged to the capacitor 50 to the gate terminal of the semiconductor switching device 1, in accordance to the first signal, which is a control signal. The drain terminal of the first switching device 61 is connected to one terminal of the capacitor 50, and the source terminal of the first switching device 61 is connected to the output terminal 71, the drain terminal of the second switching device 62, and the output reference terminal of the first rectifier circuit 40a. The gate terminal of the first switching device 61 is connected to the output terminal of the first rectifier circuit 40a.

The drain terminal and source terminal of the first switching device 61 conduct when the first on voltage of the first signal is input to the gate terminal, and accordingly the one terminal of the capacitor 50 and the output terminal 71 conduct. The drain terminal and source terminal of the first switching device 61 are isolated when the first off voltage of the first signal is input to the gate terminal, for example, and accordingly the one terminal of the capacitor 50 and the output terminal 71 are isolated.

The second switching device 62 extracts the charge at the gate terminal of the semiconductor switching device 1 in accordance with the second signal, which is a control signal. The drain terminal of the second switching device 62 is connected to output terminal 71 and the source terminal of the first switching device 61, and the source terminal of the second switching device 62 is connected to the output reference terminal 72, the other terminal of the capacitor 50, and further to the output reference terminal of the second rectifier circuit 40b. The gate terminal of the second switching device 62 is connected to the output terminal of the second rectifier circuit 40b.

The drain terminal and source terminal of the second switching device 62 conduct when the second on voltage of the second signal is input to the gate terminal, for example, and accordingly the output terminal 71 and output reference terminal 72 conduct. The drain terminal and source terminal of the second switching device 62 are isolated when the second off voltage of the second signal is input to the gate terminal, for example, and accordingly the output terminal 71 and output reference terminal 72 are isolated.

Description of the operation of the half bridge circuit 60 will be omitted here, since it has been described in detail in the first embodiment. Also, the above-described second through fifth embodiments may be combined as appropriate.

Figure 22:
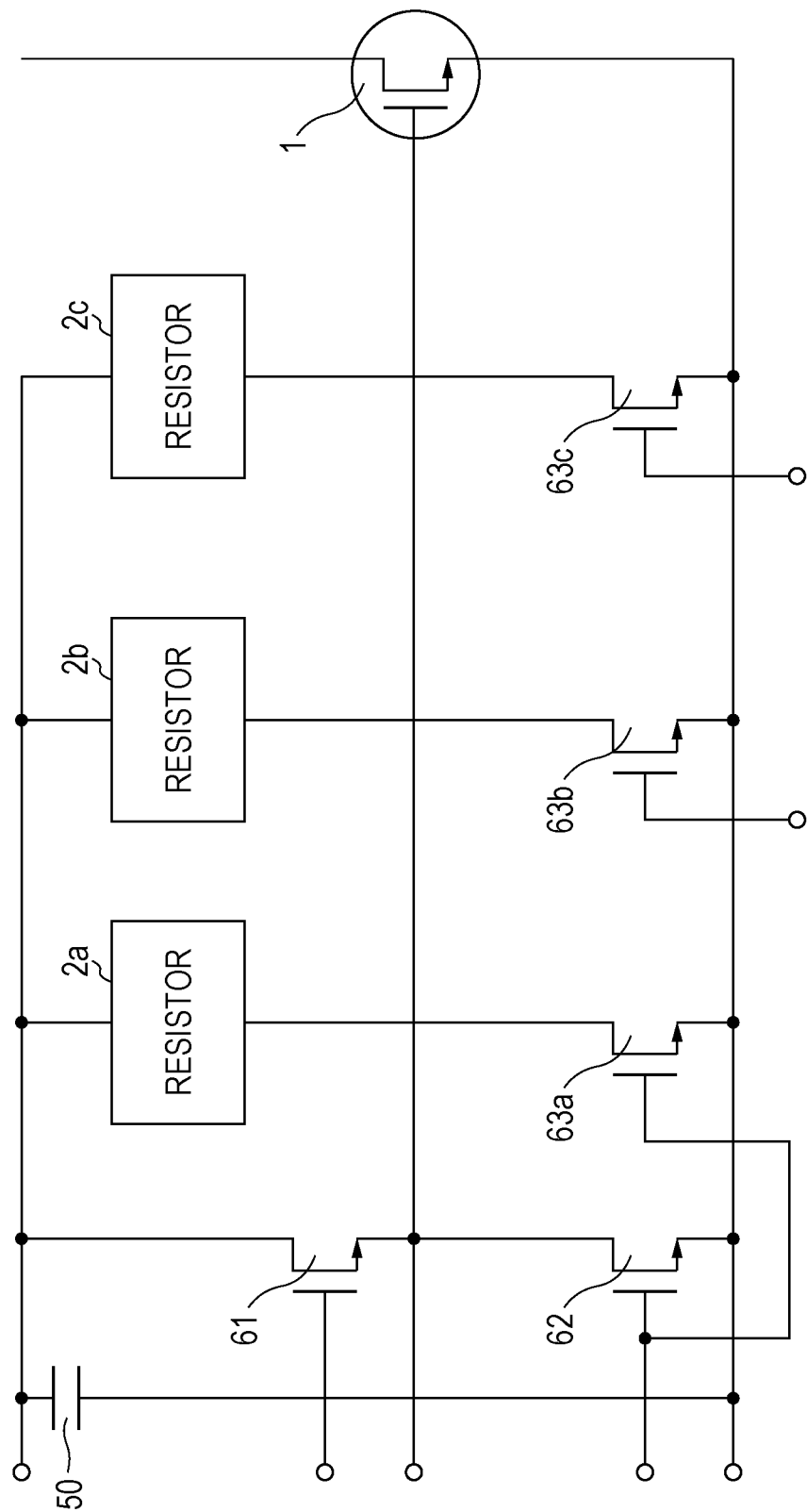
FIG. 22 is a diagram illustrating an example of a drive device having multiple charge adjustment functions.

FIG. 22 is a diagram illustrating an example of a drive device having multiple charge adjustment functions. A resistor 2a and a third switching device 63a in FIG. 22 may assume the function of the drive device according to the second embodiment (suppressing fluctuation of output waveform). A resistor 2b and a third switching device 63b in FIG. 22 may assume the function of the drive device according to the third embodiment (suppressing rising of potential in the capacitor when in standby state). A resistor 2c and a third switching device 63c in FIG. 22 may assume the function of the drive device according to the third embodiment (stopping output with time constant).

The present disclosure is useful as a gate driving circuit driving a power semiconductor device handling great electric power, for example.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A drive device that drives a semiconductor switching device, the drive device comprising:
   a capacitor;
   an output selection unit that selects whether or not to supply a charge of the capacitor to a conduction control terminal of the semiconductor switching device; and
   a charge consumption unit that supplies the charge of the capacitor to a portion other than the conduction control terminal, thereby consuming the charge of the capacitor,
   wherein a supply period is a period in which the charge of the capacitor is supplied to the conduction control terminal of the semiconductor switching device by the output selection unit,
   wherein a non-supply period is a period in which the charge of the capacitor is not supplied to the conduction control terminal of the semiconductor switching device by the output selection unit,
   wherein the supply period and the non-supply period together form one cycle,
   wherein the output selection unit generates
       a first drive cycle where the ratio of the supply period in the one cycle is a first ratio, and
       a second drive cycle where the ratio of the supply period in the one cycle is a second ratio which is larger than the first ratio, and
   wherein the amount of charge of the capacitor that is consumed by the charge consumption unit in the first drive cycle is larger than the amount of charge of the capacitor that is consumed by the charge consumption unit in the second drive cycle.

2. The drive device according to claim 1,
   wherein the charge consumption unit consumes the charge of the capacitor during the non-supply period, and does not consume the charge of the capacitor during the supply period.

3. The drive device according to claim 2, further comprising:
   a control unit that generates control signals controlling conducting states of each of a first switching device and a second switching device and a third switching device,
   wherein the output selection unit includes the first switching device and the second switching device,
   wherein the charge consumption unit includes the third switching device,
   wherein the charge of the capacitor is supplied to the conduction control terminal of the semiconductor switching device by the first switching device going to a conducting state in accordance with the control signal from the control unit,
   wherein the charge is extracted from the conduction control terminal of the semiconductor switching device by the second switching device going to a conducting state in accordance with the control signal from the control unit,
   wherein the charge of the capacitor is supplied to a portion other than the conduction control terminal by the third switching device going to a conducting state in accordance with the control signal from the control unit, there by consuming the charge of the capacitor, and
   wherein the control unit controls the conducting state of the third switching device by transmitting the control signal transmitted to the second switching device, to the third switching device as well.

4. The drive device according to claim 1, further comprising:
   a charge unit that charges the charge to the capacitor,
   wherein the charge unit charges the charge to the capacitor, over the first drive cycle and the second drive cycle.

5. A drive device that drives a semiconductor switching device, the drive device comprising:
   a capacitor;
   an output selection unit that selects whether or not to supply a charge of the capacitor to a conduction control terminal of the semiconductor switching device;
   a charge consumption unit that supplies the charge of the capacitor to a portion other than the conduction control terminal, thereby consuming the charge of the capacitor; and
   a charge unit that charges the charge to the capacitor,
   wherein the charge consumption unit consumes the charge of the capacitor during a period from charging of the charge to the capacitor by the charge unit being started, till the charge charged to the capacitor being supplied to the conduction control terminal of the semiconductor switching device by the output selection unit.

6. A drive device that drives a semiconductor switching device, the drive device comprising:
- a capacitor;
- an output selection unit that selects whether or not to supply a charge of the capacitor to a conduction control terminal of the semiconductor switching device; and
- a charge consumption unit that supplies the charge of the capacitor to a portion other than the conduction control terminal, thereby consuming the charge of the capacitor,
- wherein the output selection unit includes a first switching device and a second switching device,
- wherein the charge consumption unit includes a third switching device and a resistor,
- wherein
  - a first terminal of the capacitor and a first terminal of the first switching device are connected with each other at a first contact point,
  - a second terminal of the capacitor and a terminal of the semiconductor switching device are connected with each other at a second contact point,
  - a second terminal of the first switching device and the conduction control terminal of the semiconductor switching device are connected with each other at a third contact point,
  - a first terminal of the second switching device connects to the third contact point,
  - a second terminal of the second switching device connects to the second contact point,
  - a first terminal of the third switching device connects to a second terminal of the resistor,
  - a second terminal of the third switching device connects to the second contact point, and
  - a first terminal of the resistor connects to the first contact point, and
- wherein the third switching device is in a conducting state during a period when the first switching device is in a conducting state and the second switching device is in a non-conducting state.

7. A drive device that drives a semiconductor switching device, the drive device comprising:
- a capacitor;
- an output selection unit that selects whether or not to supply a charge of the capacitor to a conduction control terminal of the semiconductor switching device;
- a charge consumption unit that supplies the charge of the capacitor to a portion other than the conduction control terminal, thereby consuming the charge of the capacitor;
- a first electromagnetic resonance coupler;
- a rectifying unit that includes a rectifier circuit; and
- a second electromagnetic resonance coupler,
- wherein a high-frequency wave is transmitted by isolated transmission by the first electromagnetic resonance coupler, and then rectified by the rectifying unit, thereby generating charging voltage,
- wherein the capacitor is charged by the charging voltage,
- wherein a modulated signal obtained by modulating the high-frequency wave in accordance with an input signal is transmitted by isolated transmission by the second electromagnetic resonance coupler, and rectified by the rectifying unit, thereby generating control signal, and
- wherein the output selection unit selects whether or not to supply the charge of the capacitor to the conduction control terminal of the semiconductor switching device, in accordance with the control signal.

* * * * *